(12) United States Patent
Kim et al.

(10) Patent No.: US 11,018,795 B2
(45) Date of Patent: May 25, 2021

(54) METHODS AND APPARATUS FOR CODING FOR INTERFERENCE NETWORK

(71) Applicant: THE REGENTS OF THE UNIVERSITY OF CALIFORNIA, Oakland, CA (US)

(72) Inventors: Young-Han Kim, San Diego, CA (US); Lele Wang, San Diego, CA (US); Hosung Park, La Jolla, CA (US); Eren Sasoglu, Mountain View, CA (US)

(73) Assignee: The Regents of the University of California, Oakland, CA (US)

( * ) Notice: Subject to any disclaimer, the term of this patent is extended or adjusted under 35 U.S.C. 154(b) by 142 days.

(21) Appl. No.: 15/514,092

(22) PCT Filed: Sep. 29, 2015

(86) PCT No.: PCT/US2015/052986
§ 371 (c)(1),
(2) Date: Mar. 24, 2017

(87) PCT Pub. No.: WO2016/054069
PCT Pub. Date: Apr. 7, 2016

(65) Prior Publication Data
US 2017/0294981 A1    Oct. 12, 2017

Related U.S. Application Data

(60) Provisional application No. 62/057,193, filed on Sep. 29, 2014.

(51) Int. Cl.
*H04J 13/10*    (2011.01)
*H04L 1/00*     (2006.01)
(Continued)

(52) U.S. Cl.
CPC ......... *H04J 13/10* (2013.01); *H03M 13/3972* (2013.01); *H04J 13/0077* (2013.01);
(Continued)

(58) Field of Classification Search
CPC .. H03M 13/3972; H04J 13/0077; H04J 13/10; H04L 1/0041; H04L 1/0045; H04L 1/0058; H04W 72/0466; H04W 72/085
See application file for complete search history.

(56) References Cited

U.S. PATENT DOCUMENTS 6,956,872 B1 * 10/2005 Djokovic .............. H04L 1/0041
370/505
7,656,933 B2 * 2/2010 Klinke .................... G10L 21/02
375/144

(Continued)

FOREIGN PATENT DOCUMENTS

JP    2001060979 A    3/2001

OTHER PUBLICATIONS

PCTUS2015/052986, International Search Report and Written Opinion, dated Jan. 4, 2016, 9 pages.
(Continued)

*Primary Examiner* — Parth Patel
*Assistant Examiner* — Berhanu D Belete
(74) *Attorney, Agent, or Firm* — Perkins Coie LLP

(57) ABSTRACT

The disclosed techniques allow for transmitting a signal stream from a sender to a receiver in an environment including multiple senders and receivers. The technique for the sender decomposes a data stream from the sender into multiple substreams, encodes a substream by a codeword, further superimposes multiple codewords to form a signal stream in an asynchronous manner, and transmits the signal stream to the receiver. A codeword can span over multiple blocks. The receiver receives a first codeword stream from (Continued)

a first sender, receives a second codeword stream from a second sender, the two codeword streams may be received at the same time as one signal, and decodes the first codeword stream and second codeword stream over a sliding window of multiple blocks.

20 Claims, 10 Drawing Sheets

(51) Int. Cl.
| | |
|---|---|
| *H04L 1/06* | (2006.01) |
| *H04L 25/03* | (2006.01) |
| *H03M 13/39* | (2006.01) |
| *H04J 13/00* | (2011.01) |
| *H04W 72/04* | (2009.01) |
| *H04W 72/08* | (2009.01) |

(52) U.S. Cl.
CPC .......... *H04L 1/0041* (2013.01); *H04L 1/0045* (2013.01); *H04L 1/0048* (2013.01); *H04L 1/0058* (2013.01); *H04L 1/06* (2013.01); *H04L 25/03891* (2013.01); *H04W 72/0466* (2013.01); *H04W 72/085* (2013.01); *H04L 2001/0092* (2013.01)

(56) References Cited

U.S. PATENT DOCUMENTS

| | | | | |
|---|---|---|---|---|
| 8,539,288 B1* | 9/2013 | Sun | ...... | H04B 7/0413 375/227 |
| 8,769,352 B1* | 7/2014 | Sun | ...... | H04B 7/0413 375/227 |
| 9,191,051 B1* | 11/2015 | Narasimhan | ...... | H04B 7/0447 |
| 9,319,197 B2* | 4/2016 | Sahin | ...... | H04L 1/0025 |
| 9,490,938 B1* | 11/2016 | Xu | ...... | H04L 1/0054 |
| 2002/0112211 A1* | 8/2002 | Brick | ...... | H03M 13/3961 714/795 |
| 2003/0058969 A1* | 3/2003 | Sindhushayana | .... | H03M 13/114 375/340 |
| 2005/0195883 A1* | 9/2005 | Choi | ...... | H04B 1/7176 375/130 |
| 2006/0056338 A1* | 3/2006 | Abe | ...... | H04B 7/026 370/328 |
| 2007/0242895 A1* | 10/2007 | Bandou | ...... | H04N 19/147 382/251 |
| 2007/0297498 A1 | 12/2007 | Kramer | | |
| 2008/0225964 A1* | 9/2008 | Han | ...... | H04B 7/0413 375/260 |
| 2009/0028151 A1* | 1/2009 | Schmidt | ...... | H04L 47/10 370/392 |
| 2009/0115647 A1* | 5/2009 | Mittelholzer | ...... | H03M 5/145 341/80 |
| 2009/0231990 A1* | 9/2009 | Lee | ...... | H04L 1/0041 370/207 |
| 2010/0070867 A1* | 3/2010 | Lemmers | ...... | G06F 21/36 715/735 |
| 2010/0138867 A1* | 6/2010 | Wong | ...... | H04N 5/4403 725/46 |
| 2010/0189002 A1* | 7/2010 | Choi | ...... | H04B 7/0617 370/252 |
| 2010/0192219 A1* | 7/2010 | Carvajal | ...... | H04N 21/431 726/19 |
| 2010/0234035 A1* | 9/2010 | Fujishima | ...... | H04L 5/0023 455/450 |
| 2010/0246489 A1* | 9/2010 | Yang | ...... | H04B 7/0413 370/328 |
| 2010/0309281 A1* | 12/2010 | Lim | ...... | B41J 2/471 347/257 |
| 2010/0316024 A1* | 12/2010 | Kiran | ...... | H04L 1/0006 370/335 |
| 2011/0033001 A1* | 2/2011 | Roh | ...... | H04L 1/0003 375/260 |
| 2012/0069833 A1 | 3/2012 | Molnar | | |
| 2012/0127952 A1* | 5/2012 | Tong | ...... | H04B 7/0408 370/330 |
| 2012/0224691 A1* | 9/2012 | Purohit | ...... | H04L 1/04 380/255 |
| 2012/0320994 A1* | 12/2012 | Loghin | ...... | H03M 13/11 375/240.27 |
| 2012/0327891 A1* | 12/2012 | Nam | ...... | H04L 5/0094 370/329 |
| 2013/0027230 A1* | 1/2013 | Marpe | ...... | H03M 7/4006 341/107 |
| 2013/0094464 A1* | 4/2013 | Li | ...... | H04W 72/0413 370/329 |
| 2013/0177097 A1* | 7/2013 | Li | ...... | H04B 7/0434 375/267 |
| 2013/0279619 A1* | 10/2013 | Chen | ...... | H04B 7/0469 375/267 |
| 2013/0301554 A1* | 11/2013 | Nam | ...... | H04L 5/005 370/329 |
| 2013/0308657 A1* | 11/2013 | Lee | ...... | H04L 1/0041 370/480 |
| 2014/0029538 A1* | 1/2014 | Yang | ...... | H04W 52/04 370/329 |
| 2014/0085114 A1* | 3/2014 | Cideciyan | ...... | H03M 5/145 341/59 |
| 2014/0136805 A1* | 5/2014 | Shah | ...... | G06F 3/0619 711/162 |
| 2014/0140188 A1* | 5/2014 | Shattil | ...... | H04L 27/2601 370/208 |
| 2014/0146756 A1* | 5/2014 | Sahin | ...... | H04L 1/0025 370/329 |
| 2014/0210652 A1* | 7/2014 | Bartnik | ...... | H03M 7/40 341/67 |
| 2014/0321568 A1* | 10/2014 | Han | ...... | H04L 5/0051 375/267 |
| 2014/0327559 A1* | 11/2014 | Xu | ...... | H03M 7/00 341/107 |
| 2015/0029926 A1* | 1/2015 | Ryu | ...... | H04L 1/1861 370/312 |
| 2015/0055736 A1* | 2/2015 | Lee | ...... | H04L 1/0054 375/341 |
| 2015/0142456 A1* | 5/2015 | Lowe | ...... | H04H 60/04 704/503 |
| 2015/0280884 A1* | 10/2015 | Choi | ...... | H04L 25/0391 370/329 |

OTHER PUBLICATIONS

Lee, J. et al., "Interference mitigation in MIMO interference channel via successive single-user soft decoding", in Proc. UCSD Inf. Theory App,l. Workshop, 2012, pp. 180-185.
Park, H. et al., "Interference Management via Sliding-Window Superposition Coding", Globecom 2014 workshop, pp. 972-976.
Wang, L. et al., "Sliding-Window Superposition Coding for Interference Networks", IEEE International Symposium on Information Theory, 2014, pp. 2749-2753.
Yedla, A. et al., "Universal codes for the Gaussian MMAC via spatial coupling", in Proc. 49th Ann. Allerton Conf. Comm. Control Conput., 2011, pp. 1801-1808.
Tse et al., "Fundamentals of Wireless Communication; Chapter 6: Multiuser Capacity and Opportunistic Communication", Dec. 31, 2015, pp. 228-289.
Extended European Search Report for European Patent Application No. 15846316.6, dated Jun. 15, 2018, 11 pages.
Office Action for Chinese Patent Application No. 201580062606.0, dated Jul. 31, 2019, 22 pages.
IPI, Examination Report for Indian Patent Application No. 201717013178. dated Jun. 26, 2020. 7 pages.

* cited by examiner

| block $j$ | 1 | 2 | 3 | ... | $b-1$ | $b$ |
|---|---|---|---|---|---|---|
| $U$ | 1 | | | | | 1 |
| $X_1$ | $m_{11}$ | $m_{11}$ | $m_{12}$ | ... | $\vdots$ | $m_{1,b-1}$ |
| $X_2$ | $m_{21}$ | $m_{12}$ $m_{22}$ | | ... | $m_{1,b-1}$ $m_{2,b-1}$ | $m_{2b}$ |
| $Y_1$ | $\emptyset$ | $\hat{m}_{11}$ | $\hat{m}_{12}$ | ... | ... | $\hat{m}_{1,b-1}$ |
| | $\hat{m}_{21}$ | $\hat{m}_{22}$ | ... | ... | $\hat{m}_{2,b-1}$ | |
| $Y_2$ | $\emptyset$ | $\hat{m}_{11}$ | $\hat{m}_{12}$ | ... | ... | $\hat{m}_{1,b-1}$ |
| | $\emptyset$ | $\hat{m}_{21}$ | $\hat{m}_{22}$ | ... | ... | $\hat{m}_{2b}$ |

FIG. 6B

METHODS AND APPARATUS FOR CODING FOR INTERFERENCE NETWORK

CROSS-REFERENCE TO RELATED APPLICATIONS

This patent document is a 35 USC § 371 National Stage application of International Application No. PCT/US2015/052986, entitled "METHODS AND APPARATUS FOR CODING FOR INTERFERENCE NETWORK," filed on Sep. 29, 2015, which claims the benefit of priority of U.S. Provisional Patent Application No. 62/057,193, entitled "METHODS AND APPARATUS FOR CODING FOR INTERFERENCE NETWORK" filed on Sep. 29, 2014. The entire content of the above patent applications are incorporated by reference as part of this patent document.

STATEMENT REGARDING FEDERALLY SPONSORED RESEARCH OR DEVELOPMENT

This invention was made with government support under grant CCF-1320895 awarded by the National Science Foundation (NSF). The government has certain rights in the invention.

TECHNICAL FIELD

This patent document relates to methods and systems for coding and decoding data streams for communication channels.

BACKGROUND

For high data rates and massive connectivity, next generation cellular networks are expected to deploy many small base stations. While such dense deployment provides the benefit of bringing radio closer to end users, it also increases the amount of interference from neighboring cells. Consequently, smart management of interference would become one of the key enabling technologies for high-spectral-efficiency, low-power, broad-coverage wireless communication.

Various existing communications systems operate based on point-to-point channel codes and treat interference as noise. While such techniques may be able to achieve acceptable performance with low computational complexity when interference is weak, the performance degrades as interference becomes stronger, which is often the case for dense wireless networks. In particular, in the high signal-to-noise ratio/interference-to-noise ratio limit, the performance of treating interference as noise has an unbounded gap from that of simultaneous decoding. Treating interference as noise and successive cancellation decoding (with no rate-splitting) are typically the two main decoding schemes used in practice, both of which achieve strictly smaller rate regions than simultaneous decoding.

SUMMARY

Disclosed are methods and systems for coding and decoding data streams for communication channels with multiple pairs of senders and receivers. The methods and systems may achieve the performance of simultaneous decoding for general interference channels with any number of senders and receivers without using high-complexity multiuser sequence detection. The methods and systems may also achieve the performance of the Han-Kobayashi coding scheme by incorporating a rate splitting technique. It is known that simultaneous decoding is a component in the Han-Kobayashi coding scheme, in which each receiver, instead of treating interference as noise, decodes for the intended message as well as part of the interfering message. However, simultaneous decoding in a conventional Han-Kobayashi uses high-complexity multiuser sequence detection, which may be costly in implementations.

The present document describes techniques that can overcome, among other things, the above-discussed limitations of simultaneous decoding in interference channels. In one aspect, a low-complexity coding technique for communication channels including multiple pairs of senders and receivers is disclosed. The signals from the senders interfere with each other and thus the signal observed at each receiver is a mix of the desired signal as well as one or more interfering signals and some noise.

In some disclosed embodiments, a data stream is decomposed into multiple substreams. These substreams are communicated to the receivers over multiple units ("blocks") of the span of time/frequency/space dimensions. Each sender encodes each of its substreams into a codeword that spans over multiple blocks and transmits multiple codewords simultaneously by superimposing them in a staggering manner. In some embodiments, the characteristics of the codewords (coded modulation) and the mechanism of superimposing them (superposition) can be optimized with respect to the communication channel parameters as well as other transmission constraints. Each receiver recovers the codewords from its desired sender as well as some codewords from interfering senders by decoding its received signal over a sliding window of multiple blocks. In exemplary aspects, for each window, multiple codewords (both desired and interfering) can be recovered one by one (successive cancellation decoding), which allows for each decoding step to be of low-complexity. In some embodiments, the selection of the codewords to be recovered as well as their decoding order can be optimized

BRIEF DESCRIPTION OF THE DRAWINGS

FIGS. 3A through 3C show illustrative diagrams of encoding and decoding operations.

FIG. 6B shows an illustrative scheduling table of sliding-window superposition coding scheme.

DETAILED DESCRIPTION

Figure 1:
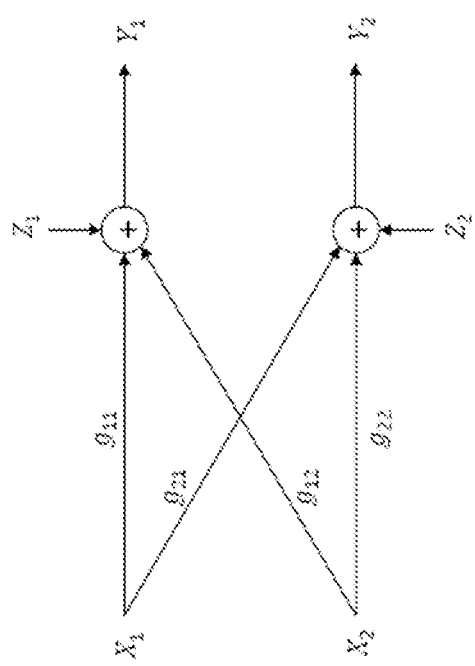
FIG. 1 shows an illustrative diagram of an exemplary two-user Gaussian interference channel.

This patent document relates to methods and systems for coding and decoding data streams for communication channels with multiple pairs of senders and receivers. Most existing communications systems, which use conventional point-to-point channel codes, treat interference as noise. While this simple scheme can achieve good performance with low computational complexity when interference is weak, the performance degrades as interference becomes stronger, which is often the case for dense wireless networks.

Over the past decades, several techniques at different protocol layers have been proposed to mitigate adverse effects of interference in wireless networks. One important conceptual technique at the physical layer is simultaneous decoding, whereby each receiver decodes for the desired signal as well as part or whole of interference. When interference is strong, the simultaneous decoding technique achieves the optimal performance for the two-user Gaussian interference channel using good point-to-point codes. Moreover, the simultaneous decoding technique achieves the optimal maximum likelihood decoding performance in general, when the encoders are restricted to point-to-point random code ensembles. The Han-Kobayashi coding scheme, which achieves the best known performance for general two-user interference channels, also uses simultaneous decoding as a crucial component. As a main drawback, however, each receiver in simultaneous decoding has to employ some form of multiuser sequence detection, which usually requires high computational complexity to implement. This issue has been tackled lately by a few approaches based on emerging spatially coupled and polar codes, but these solutions require the development of new families of codes (instead of using conventional point-to-point channel codes such as LDPC codes and turbo codes) and involve very long block lengths.

In this document, a sliding-window superposition coding (SWSC) scheme is disclosed that achieves the theoretical performance of simultaneous decoding with point-to-point channel codes and low-complexity decoding. This scheme is built on basic components of network information theory, combining the ideas of block Markov coding, and sliding-window decoding (commonly used for multi-hop relaying and feedback communication, but not for single-hop communication) and superposition coding and successive cancellation decoding (allowing low-complexity decoding with point-to-point codes). It will be appreciated that in several operational scenarios, embodiments of the disclosed schemes can be implemented either (or, both) at a mobile phone and a base station.

The disclosed sliding-window superposition coding (SWSC) scheme achieves the performance of simultaneous decoding with point-to-point channel codes and low-complexity decoding. This document discloses how the coding scheme works at a conceptual level for general interference channels with two or more sender-receiver pairs and how the coding scheme can be transformed to a practical coding technique for Gaussian interference channels under modulation constraints. Simulation results show that sliding-window superposition coding can sometimes double the performance of the conventional method of treating interference as noise, using the standard LTE turbo codes at a moderate block length, e.g. 2048. Even though the simulation results pertain to an exemplary scenario involving two users, the disclosed techniques can be easily applied to scenarios with more than two users.

Using at most two superposition layers, the disclosed SWSC technique achieves the simultaneous decoding inner bound for any two-user-pair interference channels without using high-complexity simultaneous multiuser sequence detection. The disclosed coding scheme can be also extended to achieve the theoretical performance of simultaneous decoding for general interference networks, including the Han-Kobayashi inner bound.

In most existing coding techniques for interference channels, interference is usually ignored as part of noise, incorporating the signal structure (modulation order) and/or power of the interference. When the modulation/power information is used as part of a coding technique, such a technique is referred herein as "treating interference as noise." When only the power information is used as part of a coding technique, such a technique is referred herein as "treating interference as Gaussian noise."

According to a coding technique, a receiver can successively recover some interfering codewords and the desired codeword, while ignoring the rest (e.g., the interfering codewords that are not to be recovered) as part of noise. This coding technique may be called "successive interference cancellation." Thus, one difference between treating interference as noise and successive interference cancellation is that in treating interference as noise, no interfering codeword is recovered.

According to another coding technique, a receiver can simultaneously recover all (e.g., both desired and interfering) codewords. This technique is termed herein as "simultaneous decoding" or "joint decoding." It is known that simultaneous decoding outperforms the above two coding techniques and that it achieves the optimal performance over all decoding techniques. In some embodiments of the above-mentioned techniques, it is assumed that a single data substream is carried by a single codeword communicated over a single block.

FIG. 1 shows an illustrative block diagram of an exemplary two-user Gaussian interference channel. The disclosed SWSC technique achieves the best features of the both worlds the performance of simultaneous decoding at a low complexity of successive cancellation decoding. For some implementations, successive cancellation decoding cannot achieve the performance of simultaneous decoding. However, SWSC circumvents this limitation of successive cancellation decoding by:

(1) communicating a data stream by decomposing them into multiple substreams;
(2) carrying each substream by a codeword that spans over multiple blocks;
(3) superimposing multiple codewords for transmission;
(4) transmitting the superimposed multiple codewords in a staggered (asynchronous) manner;
(5) decoding the received signal over a sliding window of blocks; and
(6) recovering codewords from the desired and interfering senders successively.

Each of these component technologies has been established, directly or indirectly, in the literature. The components in (1) and (2) are commonly called "block Markov coding," which has been used widely in relaying. The component in (3) is mostly used in a single-block coding and called "superposition coding," having been introduced for broadcasting multiple data streams from a single sender. The component in (4) has been used for multiple access systems (such as EV-DO Rev A) or multiple-antenna communication systems (such as D-BLAST or Diagonal Bell Labs Layered Space Time). The component in (5) is called "sliding-window decoding" and again commonly used in relaying. The component in (6) is called "successive cancellation decoding" or "successive interference cancellation" and has been used widely for multiple access systems. One aspect that is novel about the disclosed techniques is the careful manner these components are combined and the application of the combined product in mitigating interference to achieve better performance for interference channels.

There are a few additional features of SWSC. First of all, as discussed herein, SWSC can achieve the performance of simultaneous decoding. This is attained by optimizing codeword superposition structures at the senders and decoding orders at the receivers. However, even for a suboptimal choice of superposition structure and decoding order, the resulting performance can be easily evaluated using basic tools in network information theory. A suboptimal choice can be, thus, helpful when the system has additional constraints that do not allow for the optimal superposition structure or decoding order. Also, the decoding order can be switched adaptively from one structure to another, as the channel condition changes. Finally, SWSC can be easily implemented using the existing off-the-shelf channel codes, such as turbo and LDPC codes. As a matter of fact, SWSC can be combined in a fairly straightforward manner with most existing techniques developed for single-block communication, such as rate-splitting, multi-level coding, and hybrid ARQ.

Sliding-Window Superposition Coding for the Gaussian Interference Channel

FIG. 1 illustrates a block diagram of the two-user Gaussian interference channel. The two-user Gaussian interference channel is defined as $$Y_1 = g_{11}X_1 + g_{12}X_2 + Z_1,$$

$$Y_2 = g_{21}X_1 + g_{22}X_2 + Z_2, \quad (1)$$

Here, $X_i \in X^n$, $i=1, 2$ is a transmitted signal from sender i with average power constraint $P_i$, where n is the block length and $Y_i \in \mathbb{R}^n$ is a received signal at receiver i, $Z_i \in \mathbb{R}^n \sim N(0, 1)$, $i=1, 2$, are noise components. It is assumed that each receiver i knows local channel gain coefficients $g_{ij} \in \mathbb{R}$, $j=1, 2$, from both senders, which are held fixed during the communication.

The Sliding-window superposition coding (SWSC) technique is based on several basic building blocks in network information theory such as superposition coding, block Markov coding, successive cancellation decoding, and sliding-window decoding. Sender i encodes its messages by using superposition coding with multiple superimposed layers and block Markov coding throughout multiple blocks. Receiver i performs successive cancellation decoding of all superimposed layers from sender i and some superimposed layers from the other sender within a window length according to a predetermined decoding order and slides the decoding window until it reaches the end of blocks. The encoding/decoding process of the specific version of SWSC considered in this patent document is now elaborated in greater detail.

For block j=1 ... b, let $m(j) \in \{1, 2 ... 2^{nr_i}\}$ be the message to be communicated from sender i to receiver i. Similarly, let $X_1(j)$, $Y_1(j)$, and $Z_1(j)$ be the channel input, output, and noise for sender/receiver i in block j.

In some embodiments, the disclosed SWSC technique allows for full flexibility in the number of superimposed layers, the number and structure of auxiliary random variables for superposition coding, and the decoding order. For purposes of discussion and illustration, the example provided involves two layers of BPSK (binary phase shift keying) signals that form a 4-PAM (pulse amplitude modulation) signal by superposition and a fixed decoding order. In particular, $$X_1(j) = \sqrt{P_1}\sqrt{\alpha}U(j) + \sqrt{P_1}\sqrt{1-\alpha}V(j),$$

$$X_2(j) = \sqrt{P_2}W(j), \quad (2)$$

where U (j), V (j), and W (j)$\in \{-1, +1\}^n$ are BPSK signals.

Figure 2:
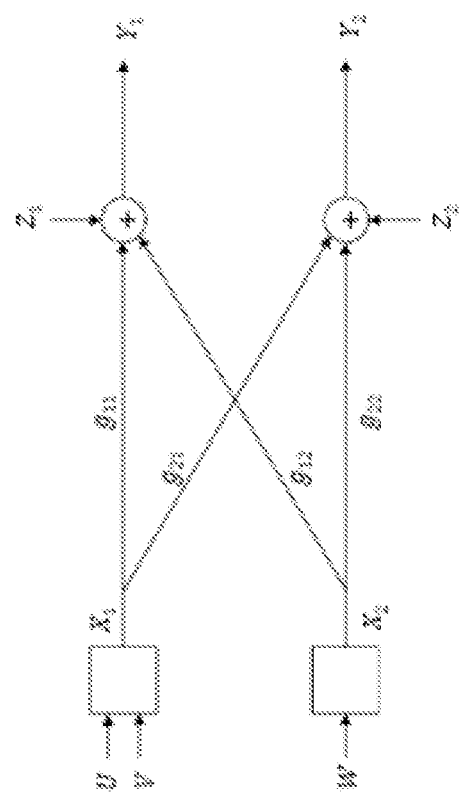
FIG. 2 shows an illustrative diagram of a superposition coding with three virtual input signals.
Figures 4A, 4B, 4C, 4D:
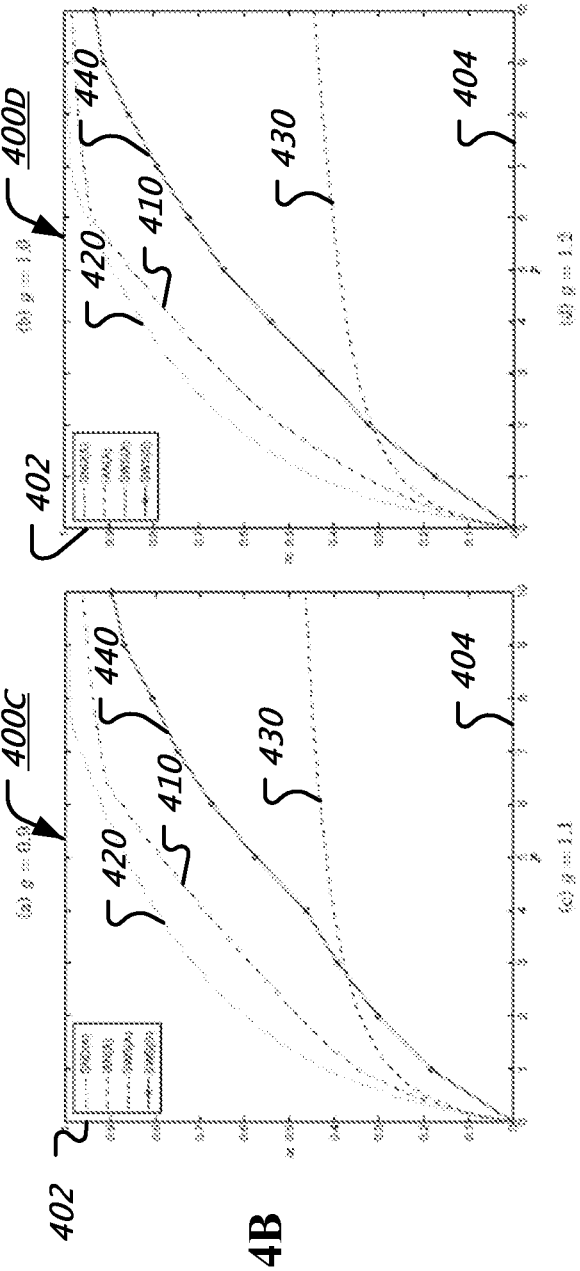
FIGS. 4A through 4D show an illustrative diagram of a performance evaluation of an embodiment.

FIG. 2 shows an illustrative diagram of a superposition coding with three virtual input signals (two input signals for sender 1 and one input signal for sender 2). Specifically, FIG. 2 represents the superposition coding with U and V for $X_1$, and with W for $X_2$. The encoding and decoding operations associated with superposition coding are discussed in FIGS. 3A-3C.

Figures 3A, 3B, 3C:
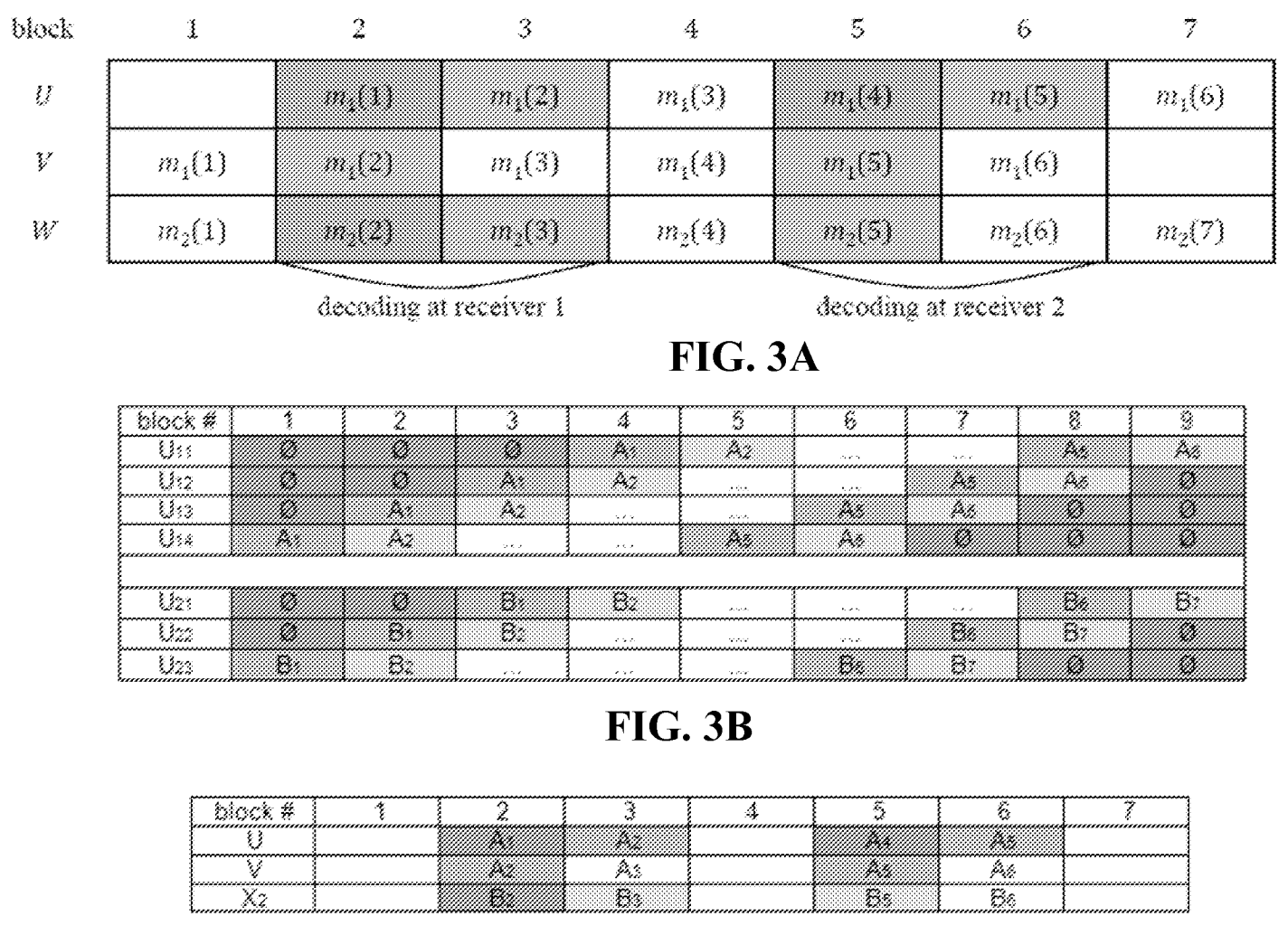

FIGS. 3A-3C show illustrative diagrams of encoding and decoding operations associated with superposition coding. Specifically, FIG. 3A shows the encoding and decoding operations for 7 blocks. The message $m_1$ (2) is carried by signals V (2) and U (3), while the message $m_2$ (5) is carried by W (5). The sliding-window decoding of $m_1(2)$ at receiver 1 is based on its received signals $Y_1$ (2) and $Y_1$ (3) over two blocks. Receiver 1 first recovers $m_1(2)$ (equivalently, V (2) and U (3)) and then recovers $m_2$ (3) (equivalently, W (3)). The signals U (2) and W (2) are already known from the previous decoding window. Receiver 2 operates slightly differently by recovering first $m_1$ (5) and then $m_2$ (5) based on two blocks $Y_1$ (5) and $Y_1$ (6).

FIG. 3B shows the staggering of 4 signal layers at sender 1, and 3 substreams at sender 2, where Ø denotes a predetermined signal for initialization and finalization. The SWSC technique is illustrated for an interference channel with two sender-receiver pairs. Sender 1 transmits the signal X1, receiver 1 receives the signal Y1, sender 2 transmits the single X2, and receiver 2 receives signal Y2. Suppose sender 1 wishes to communicate data stream A to receiver 1 and sender 2 wishes to communicate data stream B to receiver 2. Data streams A and B are divided into substreams A1, A2, ... and B1, B2, .... These substreams are transmitted over multiple blocks in a staggering manner as shown in FIG. 3B.

In FIG. 3B, U11 through U14 are signals that are superimposed to generate X1, and U21 through U23 are signals that are superimposed to generate X2. These signals are called "layers" and the number of layers can be arbitrary and different from one sender to another. This superposition operation can be performed in an arbitrary manner over arbitrary spaces for U signals. As shown in FIG. 3B, each substream is carried by a codeword that spans over multiple blocks and layers. For example, substream A1 is encoded into a codeword that spans over layer U14 in block 1, layer U13 in block 2, layer U12 in block 3, and layer U11 in block 4. In each block, senders superimpose their U signals to generate X signals and transmit them. For example, in block 3, sender 2 superimposes layer U21 portion of codeword for B1, layer U22 portion of codeword for B2, and layer U23 portion of codeword for B3 to generate X2 and transmits X2. Depending on the number of layers, at the beginning and the end of communication, predetermined signals (marked as Ø in FIG. 3B) are transmitted. It is noted that the staggering structure in FIG. 3B is for illustrative purposes only. In some embodiments, a more sophisticated staggering can be used by indexing the blocks in higher-dimensional arrays. In some embodiments, transmissions from each sender can be shifted with respect to one another. For example, to delay the transmission from sender 1 by the offset of 1 block, substream A1 in FIG. 3B can be set to Ø.

Each receiver recovers its desired substream by decoding its received signals over a window of multiple blocks. A receiver can choose from multiple options for decoding its signals. In some embodiments, a decoder can decode for only the desired substream by ignoring the interfering signal as noise, or alternatively, a decoder can decode for both the desired and the interfering substreams. When decoding for both the desired and the interfering substreams, a decoder can perform successive cancellation decoding, namely, it can recover one substream, cancel it, then recover the other substream. The decoding order of substreams can be arbitrary. The decoding order as well as the option of decoding for interference or not can be switched from one receiver to another as a receiver slides the decoding window.

Even though the example herein discusses two user pairs, embodiments of the present document can be readily extended to multiple user pairs. Moreover, embodiments of the present document can be also combined with other coding techniques such as rate splitting, multi-level coding, and hybrid ARQ.

Referring to FIG. 3C, an example is provided to illustrate how SWSC works. It is assumed that each block consists of n transmission units (subcarriers and time units in OFDM). Sender 1 uses two signal layers, denoted by U and V, each of them being BPSK. These two BPSK signals are properly scaled and added to generate a 4-PAM signal X1. Sender 2 uses a single layer; thus the signal U for sender 2 is a BPSK signal X2. Codewords for substreams A1, A2, . . . are encoded by a turbo code of rate R1 and length 2n; each codeword is over 2 blocks and consists of one U sequence and one V sequence. For example, substream A2 is carried by a codeword with signal V in block 2 and signal U in block 3. Codewords for substreams B1, B2, are encoded directly to X2 by a turbo code of rate R2 and length n. In this example, it is assumed that both receivers recover both substreams. Receiver 1 recovers substreams successively in the following order: B1 (from block 1), A1 (from blocks 1 and 2), B2 (from block 2), A2 (from blocks 2 and 3), and so on. For example, A2 is recovered by decoding its received signals in blocks 2 and 3 after cancelling known signals, namely, U(2) [known from previous decoding of A1] and X2(2) [known from previous decoding of B2].

Receiver 2 recovers substreams successively in the following order: A1 (from blocks 1 and 2), B1 (from block 1), A2 (from blocks 2 and 3), B2 (from block 2), and so on. For example, A5 is recovered by decoding its received signals in blocks 5 and 6 after cancelling U(5); then B5 is recovered by decoding its received signal in block 5 after cancelling U(5) and V(5).

The encoding and decoding operations are depicted in FIG. 3C. The signal U (j) carries the message $m_1(j-1)$ from the previous block, and V (j) and W (j) carry $m_1$ (j) and $m_2$ (j), respectively, from the current block. By convention, $m_1(0)=m_1(b)=1$. The parameter $\alpha$ determines the ratio of powers split into U (j) and V (j). Throughout this paper, $\alpha=0.8$, which makes $X_1 \in \{-3\sqrt{P_1}/\sqrt{5}, -\sqrt{P_1}/\sqrt{5}, +\sqrt{P_1}/\sqrt{5}, +3\sqrt{P_1}/\sqrt{5}\}$ a uniformly-spaced 4-PAM signal.

The corresponding channel outputs are $$Y_1(j) = g_{11}\sqrt{P_1}\sqrt{\alpha}\,U(j) + g_{11}\sqrt{P_1}\sqrt{1-\alpha}\,V(j) + g_{12}\sqrt{P_2}\,W(j) + Z_1(j),$$

$$Y_2(j) = g_{21}\sqrt{P_1}\sqrt{\alpha}\,U(j) + g_{21}\sqrt{P_1}\sqrt{1-\alpha}\,V(j) + g_{22}\sqrt{P_2}\,W(j) + Z_2(j).$$

At the end of block j+1, receiver 1 first decodes $Y_1(j)$ and $Y_1(j+1)$ to recover $m_1$ (j) carried by V (j) and U (j+1). Here, U (j) and W (j) are already known from the previous decoding window and thus the effective channel output from $Y_1(j)$ is $g_{11}\sqrt{P_1}\sqrt{1-\alpha}V(j)+Z_1(j)$. This decoding step is successful if $$r_1 \leq I(U;Y_1)+I(V;Y_1|U,W) \qquad (3)$$

Receiver 1 then decodes $Y_1$ (j+1) to recover $m_2$ (j+1) carried by W (j+1), where U (j+1) is known from the first step and V (j+1) is interference. This decoding step is successful if $$r_2 \leq I(W;Y_1|U). \qquad (4)$$

At the end of block j+1, receiver 2 first decodes $Y_2(i)$ and $Y_2$ (j+1) to recover $m_1$ (j) carried by V (j) and U (j+1), where U (j) is known from the previous decoding window and V (j) is interference. Receiver 2 then decodes $Y_2(i)$ to recover $m_2$ (j) carried by W (j), where U (j) and V (j) are already known. These decoding steps are successful if $$r_1 \leq I(U,V;Y_2), \qquad (5)$$

$$r_2 \leq I(W;Y_2|U,V) \qquad (6)$$

At the end of the last block j=b, receiver 2 additionally decodes $Y_2(b)$ to recover $m_2(b)$ carried by W (b), which is again successful if (6) holds. Since $m_1$ (1), . . . , $m_1$ (b−1) and $m_2$ (1), . . . , $m_2$ (b) are sent over b blocks, the actual rate for sender/receiver 1 is $R_1=r_1$ (b−1)/b and the actual rate for sender/receiver 2 is $R_2=r_2$. Combining these results (4)-(6), the following rate region can be achieved asymptotically, with SWSC:

$$R_1 \leq \min\{I(U;Y_1)+I(V;Y_1|U,W), I(U,V;Y_2)\}$$

$$R_2 \leq \min\{I(W;Y_1|U), I(W;Y_2|U,V)\}, \qquad (7)$$

where U, V, and W are independent Unif $\{-1, +1\}$ random variables.

FIGS. 4A-4D and FIG. 5 show illustrative diagrams 400A, 400B, 400C, 400D, and 500 of performance evaluations of an embodiment. Specifically, in these figures, the theoretical performance of sliding-window superposition coding (SWS(A)) 410 is compared to (i) the theoretical performance for simultaneous nonunique decoding (SND (A)) 420 and (ii) treating interference as noise (IAN(A)) 430, for various values of channel gains g. Additionally, simulation results for an implementation SWS(S) 440 are shown overlaid in FIGS. 4A-4D along with the theoretical performance curves.

In the original SWSC scheme, the auxiliary signals U, V, and Was well as the superposition mapping $x_1$ (u, v) can be chosen optimally, which guarantees that SWS(A) 410 is identical to SND(A) 420. In the performance evaluation example, the auxiliary signals are considered to be BPSK so that $X_1$ is uniformly-spaced 4-PAM. Therefore, it is a priori unclear whether SWS(A) 410 would be close to SND(A) 420.

For simplicity, it is assumed that the symmetric rate, power, and channel gains, that is, $R_1=R_2=R$, $P_1=P_2=P$, $g_{11}=g_{22}=1$, and $g_{12}=g_{21}=g$. For evaluating the performance, the transmit power P is varied, thereby affecting the signal to-noise ratio (SNR) and interference-to-noise ratio (INR) and accordingly finding the minimum power P that achieves the given rate R for SND(A) 420, IAN(A) 430, and SWS(A) 410. The plots of the minimum symmetric transmit power P (displayed on axis 404) vs. the achievable symmetric rate R (displayed on axis 402) are shown in FIGS. 4A-4D for g=0.9, 1.0, 1.1, 1.2. It is noted that the gap between SWS(A)

410 and SND(A) 420 is due to the suboptimal choice of U and V, e.g., using the BPSK modulation scheme. Nonetheless, SWS(A) 410 approaches SND(A) 420 and significantly outperforms IAN(A) 430 in high SNR. It can be checked that the performance of the implementation, SWS(S) 440, tracks the theoretical performance of SWS(A) 410, confirming the feasibility of sliding-window superposition coding. It is noted that SWS(S) 440 outperforms IAN(A) 430 in high SNR. It is noted that IAN(A) is the theoretical performance bound of treating interference as noise, whose actual performance (under a fair comparison) would be even worse.

To implement SWSC with point-to-point channel codes, a binary linear code of length 2n and rate $r_1/2$ for [V (j)|U (j+1)] is used, as U (j+1) and V (j) carry $m_1(j)$ in common. Similarly, a binary linear code of length n and rate $r_2$ for W (j) is used to carry $m_2(j)$. The turbo codes used in the LTE standard is used, which allow flexibility in code rate and block length. In particular, the performance evaluation is started with the rate ⅓ mother code and adjusting the rates and lengths according to the rate matching algorithm in the standard. It is noted that for $r_1<⅔$, some code bits are repeated and for $r_1>⅔$, some code bits are punctured. To evaluate the performance of SWSC, the block length n and the number of blocks b are set to 2048 and 20, respectively. Here, it is noted that b is the total number of blocks, not the size of the decoding window (which is 2). Every message is recovered with one-block delay. While a larger b reduces the rate penalty of 1/b, it also incurs error propagation over multiple blocks, both of which were properly taken into account in the rate and BER calculation. The LOG-MAP algorithm for the turbo decoding is used, with the maximum number of iterations set to 8 for each stage of decoding. It is assumed that a rate pair ($R_1$, $R_2$) is achieved for given $P_i$ and $g_{ij}$ if the resulting bit-error rate (BER) is below 0.001 over 1000 independent sets of simulations.

The performance evaluation of the symmetric case is discussed first, i.e., with symmetric rate, power, and channel gains, that is, $R_1=R_2=R$, $P_1=P_2=P$, $g_{11}=g_{22}=1$, and $g_{12}=g_{21}=g$. The results of the simulation are overlaid in FIGS. 4A-4D along with the theoretical performance curves.

Figure 5:
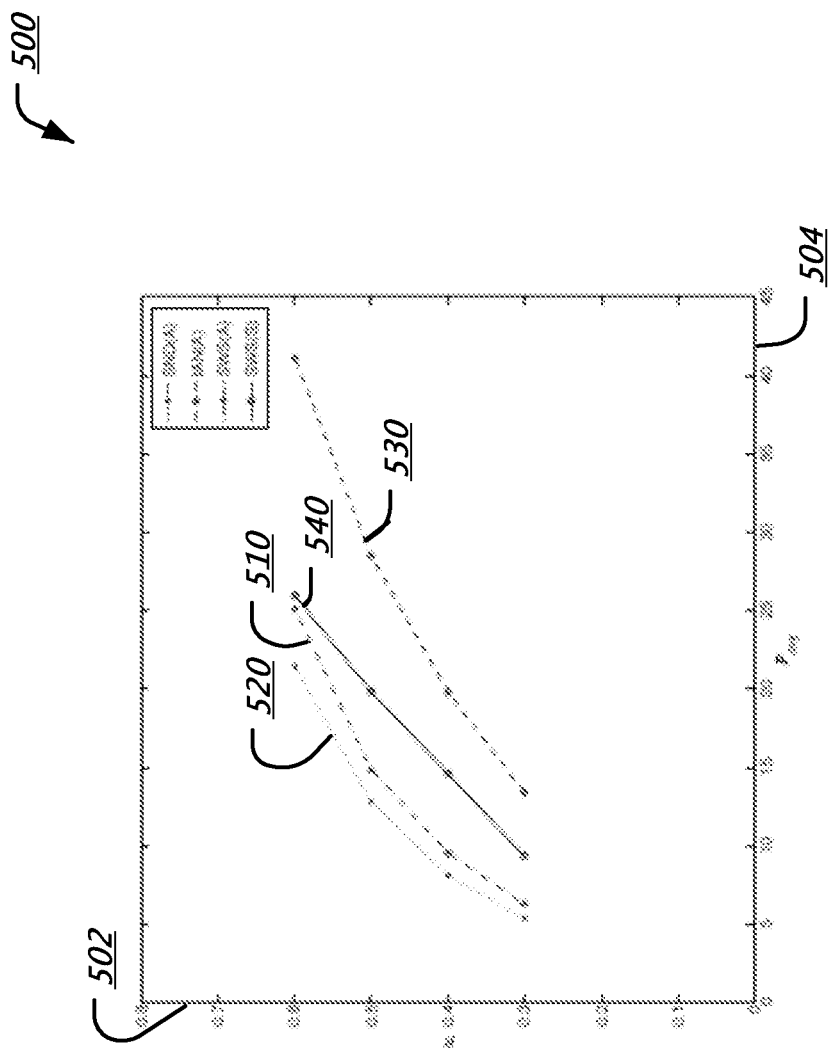
FIG. 5 shows another illustrative diagram of a performance evaluation of an embodiment.

Now referring to FIG. 5, an illustrative diagram of a performance evaluation of an embodiment is shown. As another feasibility test, the Gaussian fading interference channel is considered, where $g_{ij}$ are i.i.d.~N(0, 1). For purposes of the simulation, 25 sets of independent channel gain coefficients are generated, in order to evaluate the performance of SWSC under various channel conditions. The average minimum power $P_{avg}$ (displayed on axis 504) is calculated over the 25 channel realizations for R=0.3, 0.4, 0.5, 0.6, where R is displayed on axis 502. As shown in FIG. 5, SWS(A) 410 is very close to SND(A) 420, which is tracked by the actual implementation SWS(S) 440. It is noted that SWS(S) 440 is consistently better than IAN(A) 430, with the gap becoming larger in high rate/high SNR regime.

According to embodiments as disclosed herein, the curves in FIGS. 4A-4D and FIG. 5 indicate that the sliding-window superposition coding (SWSC) scheme has potential as a practical channel coding technique for interference management. In some embodiments, the decoding orders at the receivers can be further optimized. For example, SWSC can always achieve the performance of treating interference as noise under certain decoding orders. In some embodiments, the structure of the superposition mapping can be further optimized, especially, by the power ratio control ($\alpha\neq0.8$).

Theoretical Performance Comparison

In this section, treating interference as noise and simultaneous nonunique decoding for the channel model in (1) is considered and the theoretical performance of SWSC is compared to them.

A. Treating Interference as Noise

The achievable rate region of treating interference as noise is characterized by $$R_1 \leq I(X_1;Y_1),$$

$$R_2 \leq I(X_2;Y_2) \quad (8)$$

where $X_1$ is Unif $\{-3\sqrt{P_1}/\sqrt{5}, -\sqrt{P_1}/\sqrt{5}, +\sqrt{P_1}/\sqrt{5}, +3\sqrt{P_1}/\sqrt{5}\}$ and $X_2$ is Unif $\{\sqrt{P_2}, +\sqrt{P_2}\}$ as in (2). The receivers here use the constellation (modulation) information of interference instead of the simple signal-to-interference-noise ratio (SINR) metric, but they do not decode for the interference codewords.

B. Simultaneous Nonunique Decoding

In simultaneous decoding, each receiver recovers codewords from both senders. Here, a variant of simultaneous decoding called simultaneous nonunique decoding is considered, which provides an improved performance by disregarding the uniqueness of the interference codeword. The achievable rate region of simultaneous nonunique decoding is characterized by $$R_1 \leq I(X_1;Y_1|X_2),$$

$$R_2 \leq I(X_2;Y_2|X_1),$$

$$R_1 + R_2 \leq \min\{I(X_1,X_2;Y_1), I(X_1,X_2;Y_2)\}, \quad (9)$$

where $X_1$ and $X_2$ are again given as in (2). Simultaneous nonunique decoding achieves the capacity region when interference is strong, that is, $g_{21}^2 \geq g_{11}^2$ and $g_{12}^2 \geq g_{22}^2$.

Figure 6A:
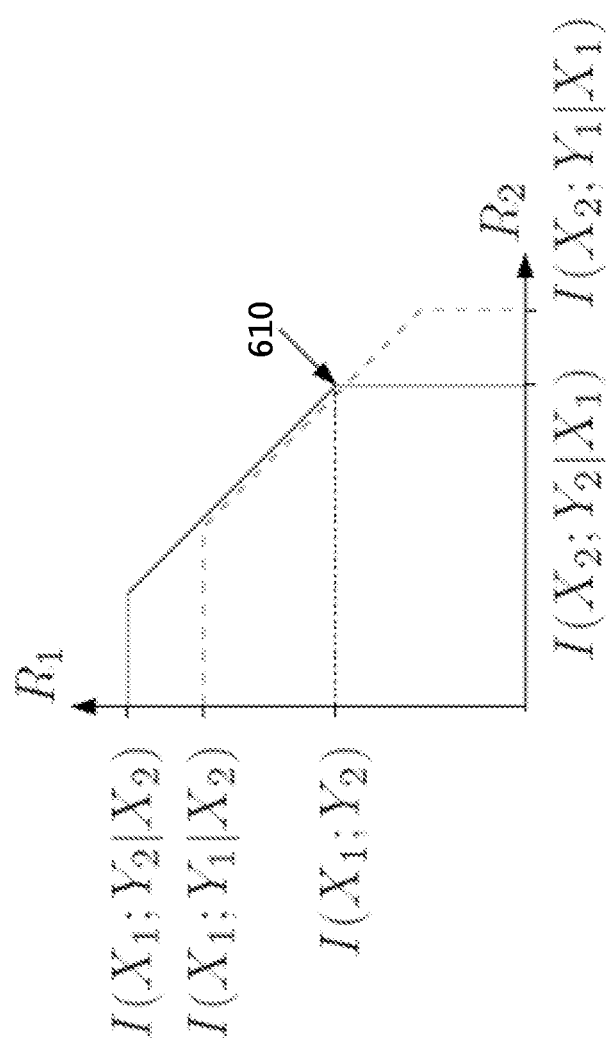
FIG. 6A shows an illustrative diagram of a simultaneous decoding inner bound and a corner point.

FIG. 6A shows an illustrative diagram of a simultaneous decoding inner bound and a corner point. FIG. 6B shows an illustrative scheduling table of sliding-window superposition coding. In this section, a sliding-window superposition coding scheme that resolves the difficulty in single-block rate splitting is disclosed. The coding scheme disclosed is applicable for the general discrete memoryless interference channels. For purposes of illustration and discussion, the discussions are focused on how to achieve the corner point $$(R_1,R_2)=(I(X_1;Y_2), I(X_2;Y_2|X_1)) \quad (10)$$

of the simultaneous decoding inner bound when $Q=\emptyset$ and the sum-rates are equal, i.e., $$I(X_1,X_2;Y_1)=I(X_1,X_2;Y_2) \quad (11)$$

as shown in FIG. 6A. In FIG. 6A, the simultaneous decoding inner bound and the corner point shown by (10) (and indicated illustratively as corner point 610 in FIG. 6A). For the symmetric Gaussian interference channel, this is the exact same point that demonstrates the insufficiency of single-block rate-splitting discussed later herein.

Theorem 1:

A rate pair ($R_1$, $R_2$) is achievable with the sliding-window superposition coding scheme if $$R_1 < \min\{I(U;Y_1)+I(X_1;Y_1|U,X_2), I(X_1;Y_2)\} := I_1,$$

$$R_2 < \min\{I(X_2;Y_1|U), I(X_2;Y_2|X_1)\} := I_2$$

for some pmf p(u,$x_1$) p ($x_2$). In addition, there exists a pmf p(u,$x_1$) p ($x_2$) such that ($I_1$,$I_2$)=(I($X_1$; $Y_2$), I($X_2$; $Y_2|X_1$)); in other words, the corner point (10) is achievable.

Roughly speaking, instead of splitting the message $M_1$ into two parts and recovering the two parts separately, according to some disclosed embodiments, $M_1$ is sent without split over two consecutive blocks and recovered using sliding-window decoding. Details are as follows.

Codebook Generation.

The pmf $p(u,x_1)p(x_2)$ that attains the target rate pair is fixed. A codebook for each block is generated randomly and independently. By convention, $m_{10}=m_{1b}=1$ is assumed. For $j\in[1:b]$, $2^{nR_1}$ sequences are randomly and independently generated, $u^n(m_{1,j-1})$, $m_{1,j-1}\in[1:2^{nR_1}]$, each according to a product of $p(u)$. For each $m_{1,j-1}$, $2^{nR_1}$ sequences are randomly and conditionally independently generated, $x_1^n(m_{1,j}|m_{1,j-1})$, $m_{1,j}\in[1:2^{nR_1}]$, each according to a product of $p(x_1|u)$. Also, $2^{nR_2}$ sequences are randomly and independently generated, $x_2^n(m_{2,j})$, $m_{2,j}\in[1:2^{nR_2}]$, each according to a product of $p(x_2)$. This defines the codebook $$C_j=\{u^n(m_{1,j-1}),x_1^n(m_{1,j}|m_{1,j-1}),x_2^n(m_{2,j}),$$

$$m_{1,j-1},m_{1,j}\in[1:2^{nR_1}],m_{2,j}\in[1:2^{nR_2}]\},j\in[1:b].$$

Encoding.

Sender 1 transmits $x_1^n(m_{1,j}|m_{1,j-1})$ and sender 2 transmits $x_2^n(m_{2,j})$ in block $j\in[1:b]$.

Decoding and Analysis of Error.

Decoder 1 (and 2, respectively) successively recovers $\hat{m}_{2,j}$ and $\hat{m}_{1,j}$ ($\hat{m}_{1,j}$ and $\hat{m}_{2,j}$), $j\in[1:b]$, where the decoding of $\hat{m}_{1,j}$ is done by a sliding-window decoding over blocks $j$ and $j+1$. FIG. 6B shows an illustrative scheduling table of sliding-window superposition coding for both encoding and decoding. Additional discussions in connection with the scheduling table are provided in the section entitled "Exemplary Embodiments of the SWSC Scheme" later herein.

Let the received sequences in block $j$ be $y_1^n(j)$ and $y_2^n(j)$, $j\in[1:b]$. For receiver 1, in block 1, it finds the unique message $\hat{m}_{21}$ such that $$(x_2^n(\hat{m}_{21}),y_1^n(1),u^n(1))\in\mathcal{T}_\epsilon^{(n)}$$

(and declares an error if there is none or more than one). By standard analysis, the probability of error tends to zero if $R_2<I(X_2;Y_1|U)-\delta(\epsilon)$. In block $j+1$, $j\in[1:b-1]$, receiver 1 finds the unique message $\hat{m}_{1,j}$ such that $$(u^n(\hat{m}_{1,j-1}),x_1^n(\hat{m}_{1,j}|\hat{m}_{1,j-1}),x_2^n(\hat{m}_{2,j}),y_1^n(j))\in\mathcal{T}_\epsilon^{(n)},$$

$$(u^n(\hat{m}_{1,j}),y_1^n(j+1))\in\mathcal{T}_\epsilon^{(n)}$$

simultaneously. The probability of error tends to zero if $R_1<I(X_1;Y_1|U,X_2)+I(U;Y_1)-2\delta(\epsilon)$. Then it finds the unique $\hat{m}_{2,j+1}$ such that $$(x_2^n(\hat{m}_{2,j+1}),y_1^n(j+1),u^n(\hat{m}_{1,j}))\in\mathcal{T}_\epsilon^{(n)}.$$

The probability of error tends to zero if $R_2<I(X_2;Y_1|U)-\delta(\epsilon)$. For receiver 2, in block $j+1$, $j\in[1:b-1]$, it finds the unique $\hat{m}_{1,j}$ such that $$(u^n(\hat{m}_{1,j-1}),x_1^n(\hat{m}_{1,j}|\hat{m}_{1,j-1}),y_2^n(j))\in\mathcal{T}_\epsilon^{(n)},$$

$$(u^n(\hat{m}_{1,j}),y_2^n(j+1))\in\mathcal{T}_\epsilon^{(n)}$$

simultaneously. The probability of error tends to zero if $R_1<I(X_1;Y_2|U)+I(U;Y_2)-2\delta(\epsilon)=I(X_1;Y_2)-2\delta(\epsilon)$. Then receiver 2 finds the unique $\hat{m}_{2,j}$ such that $$(x_2^n(\hat{m}_{2,j}),y_2^n(j),u^n(\hat{m}_{1,j-1}),x_1^n(\hat{m}_{1,j}|\hat{m}_{1,j-1}))\in\mathcal{T}_\epsilon^{(n)}.$$

The probability of error tends to zero if $R_2<I(X_2;Y_2|X_1)-\delta(\epsilon)$. In the end, receiver 2 finds the unique $\hat{m}_{2b}$ such that $$(x_2^n(\hat{m}_{2b}),y_2^n(b),u^n(\hat{m}_{1,b-1}),x_1^n(1|\hat{m}_{1,b-1}))\in\mathcal{T}_\epsilon^{(n)},$$

The probability of error tends to zero if $R_2<I(X_2;Y_2|X_1)-\delta(\epsilon)$.

Finally, it is noted that $I(X_2;Y_1)\leq I(X_2;Y_2|X_1)\leq I(X_2;Y_1|X_1)$, which guarantees the existence of $p(u|x_1)$ such that $I(X_2;Y_1|U)=I(X_2;Y_2|X_1)$. Combined with (4), this implies that $I(X_1;Y_2)=I(U;Y_1)+I(V;Y_1|X_2,U)$ and the corner point is achievable. For the symmetric Gaussian interference channels, the corner point is achieved when $U\sim N(0,\alpha P)$, $V\sim N(0,(1-\alpha)P)$ and $X_1=U+V$, where $U$ and $V$ are independent and $\alpha=(S^2+S-1)/S^2$.

Insufficiency of Single-Block Rate-Splitting

In this section, the symmetric Gaussian interference channels are considered. It is shown that a corner point of the simultaneous decoding inner bound is not achievable using rate-splitting with successive cancellation decoding. Average power constraint P is assumed. The channel outputs at the receivers for inputs $X_1$ and $X_2$ are $$Y_1=X_1+gX_2+Z_1,$$

$$Y_2=gX_1+X_2+Z_2,$$

where g is a fixed constant and $Z_1$, $Z_2\sim N(0,1)$ are additive Gaussian noise components, independent of $(X_1, X_2)$. The received signal-to-noise ratio as $I=g^2P$ is defined.

The $(s, t, d_1, d_2, F)$ rate-splitting scheme and its achievable rate region are defined as follows.

Rate Splitting.

The message $M_1$ is represented by s independent parts $M_{11}, M_{12}, \ldots, M_{1s}$ at rates $R_{11}, R_{12}, \ldots R_{1s}$, respectively, and the message $M_2$ is represented by t independent parts $M_{21}, M_{22}, \ldots M_{2t}$ at rates $R_{21}, R_{22}, \ldots R_{2t}$, is represented, respectively.

Codebook Generation.

Superposition coding is used. A cdf $F=F(q)F(u^s|q)F(v^t|q)$ is fixed such that Q is finite, $E[(V_t)^2]\leq P$. Randomly and independently $q^n$ is generated according to $\Pi_{k=1}^n F(q_k)$. Randomly and conditionally independently $2^{nR_{11}}$ sequences $u_1^n(m_{11})$ are generated, $m_{11}\in[1:2^{nR_{11}}]$, each according to a product cdf of $F(u_1|q)$. For $j\in[2:s]$, for each $m_1^{j-1}$, randomly and conditionally independently $2^{nR_{1j}}$ sequences are generated, $u_j^n(m_{1j}|m_1^{j-1})$, $m_{1j}\in[1:2^{nR_{1j}}]$, each according to a product cdf of $F(u_j|u^{j-1},q)$. Randomly and conditionally independently $2^{nR_{21}}$ sequences are generated, $v_1^n(m_{21})$, $m_{21}\in[1:2^{nR_{21}}]$, each according to a product cdf of $F(v_1|q)$. For $j\in[2:t]$, for each $m_2^{j-1}$, randomly and conditionally independently $2^{nR_{2j}}$ sequences are generated, $v_j^n(m_{2j}|m_2^{j-1})$, $m_{2j}\in[1:2^{nR_{2j}}]$, each according to a product cdf of $F(v_j|v^{j-1},q)$.

Encoding.

To send message pair $(m_1,m_2)=(m_1^s,m_2^t)$, encoder 1 transmits $x_1^n(m_1^s)=u_s^n(m_{1s}|m_1^{s-1})$ and encoder 2 transmits $x_2^n(m_2^t)=v_t^n(m_{2t}|m_2^{t-1})$.

Decoding.

Successive cancellation decoding is used. Define the decoding order $d_1$ at decoder 1 as an ordering of elements in $\{U^s, \mathcal{A}\}$ and $d_2$ at decoder 2 as an ordering of elements in $\{\mathcal{B}, V^t\}$, where $\mathcal{A}\subseteq[1:t]$ and $\mathcal{B}\subseteq[1:s]$.

As an example, suppose that message $M_1$ is split into two parts while message $M_2$ is not split. The decoding orders are $$d_1:U\to X_2\to X_1,$$

$$d_2:U\to X_1\to X_2,$$

where in case of a single split, $(U, X_1)=(U_1, U_2)$ and $X_2=V_1$ is written. This means that decoder 1 recovers $M_{11}$, $M_2$, and $M_{12}$ successively and decoder 2 recovers $M_{11}$, $M_{12}$ and $M_2$ successively. More precisely, upon receiving $y_1^n$ at decoder 1, decoding proceeds in three steps:

1) Decoder 1 finds the unique message $\hat{m}_{11}$ such that $$(u^n(\hat{m}_{11}),y_1^n,q^n)\in\mathcal{T}_\epsilon^{(n)}.$$

2) If $\hat{m}_{11}$ is found, decoder 1 finds the unique $\hat{m}_2$ such that $$(u^n(\hat{m}_{11}),x_2^n(\hat{m}_2),y_1^n,q^n)\in\mathcal{T}_\epsilon^{(n)}.$$

3) If $(\hat{m}_{11}, \hat{m}_2)$ is found, find the unique $\hat{m}_{12}$ such that $$(u^n(\hat{m}_{11}), x_2^n(\hat{m}_2), x_1^n(\hat{m}_{11}, \hat{m}_{12}), y_1^n, q^n) \in \mathcal{T}_\epsilon^{(n)}.$$

Similarly, upon receiving $y_2^n$, decoding proceeds in three steps:
1) Decoder 2 finds the unique message i such that $$(u^n(\hat{m}_{11}), y_2^n, q^n) \in \mathcal{T}_\epsilon^{(n)}.$$

2) If $\hat{m}_{11}$ is found, decoder 2 finds the unique $\hat{m}_{12}$ such that $$(u^n(\hat{m}_{11}), x_1^n(\hat{m}_{11}, \hat{m}_{12}), y_2^n, q^n) \in \mathcal{T}_\epsilon^{(n)}.$$

3) If $(\hat{m}_{11}, \hat{m}_{12})$ is found, find the unique $\hat{m}_2$ such that $$(u^n(\hat{m}_{11}), x_1^n(\hat{m}_{11}, \hat{m}_{12}), x_2^n(\hat{m}_2), y_2^n, q^n) \in \mathcal{T}_\epsilon^{(n)}.$$

Following the standard analysis of the error probability, $P_e^{(n)}$ tends to zero as $n \to \infty$ if $$R_{11} < I(U;Y_1|Q) - \delta(\epsilon), \quad (11a)$$

$$R_2 < I(X_2;Y_1|U,Q) - \delta(\epsilon), \quad (11b)$$

$$R_{12} < I(X_1;Y_1|U,X_2,Q) - \delta(\epsilon), \quad (11c)$$

$$R_{11} < I(U;Y_2|Q) - \delta(\epsilon), \quad (11d)$$

$$R_{12} < I(X_1;Y_2|U,Q) - \delta(\epsilon), \quad (11e)$$

$$R_2 < I(X_2;Y_2|X_1,Q) - \delta(\epsilon), \quad (11f)$$

By Fourier-Motzkin elimination, $(R_1, R_2)$ is achievable if $$R_1 < \min\{I(U;Y_1|Q), I(U;Y_2|Q)\} + \min\{I(X_1;Y_1|U,X_2,Q), I(X_1;Y_2|U,Q)\},$$

$$R_2 < \min\{I(X_2;Y_1|U,Q), I(X_2;Y_2|X_1,Q)\} \quad (12)$$

Some common misconception in the literature that the bounds on $R_{11}$ and $R_{12}$ in (11a)-(11f) simplify to $R_1 < \min\{I(U;Y_1|Q) + I(X_1;Y_1|U, X_2, Q), I(X_1;Y_2|Q)\}$, which leads to an incorrect conclusion that the Han-Kobayashi inner bound can be achieved by rate-splitting and successive cancellation is noted. Successive decoding requires individual rate constraints (11d) and (11e) instead of the sum-rate constraint $R_1 < I(X_1;Y_2|Q)$. Moreover, a proper application of the Fourier-Motzkin elimination procedure requires taking the minimum for four cases of sum-rates, which leads to (12).

For more layers of splitting and general decoding orders, decoding can be performed in a similar fashion. Thus, an (s, t, $d_1$, $d_2$, F) rate-splitting scheme is specified by
- the numbers s and t of independent parts in messages $M_1 = (M_{11}, \ldots, M_{1s})$ and $M_2 = (M_{21}, \ldots, M_{2t})$,
- the cdf $F = F(q)F(u^s|q)F(v^t|q)$, and
- the decoding orders $d_1$ and $d_2$.

Let $\mathcal{R}$ (s, t, $d_1$, $d_2$, F) denote the achievable rate region of the (s, t, $d_1$, $d_2$, F) rate-splitting scheme. Let $\mathcal{R}^*$ (s, t, $d_1$, $d_2$) be the closure of $\cup_F \mathcal{R}$ (s, t, $d_1$, $d_2$, F). Define $\mathcal{R}^*$ (s, t, $d_1$, $d_2$) = max $\{R_1: (R_1, C(S)) \in \mathcal{R}^*$ (s, t, $d_1$, $d_2$)$\}$ as the maximal achievable rate $R_1$ such that $R_2$ is at individual capacity.

Now the main result of this section of this section is stated with the help of a theorem. It is assumed that the symmetric Gaussian interference channel has strong but not very strong interference, i.e. $S<I<S(S+1)$. The capacity region is the set of rate pairs $(R_1, R_2)$ such that $$R_1 \leq C(S),$$

$$R_2 \leq C(S),$$

$$R_1 + R_2 \leq C(I+S),$$

which is achieved by simultaneous decoding with $X_1$, $X_2 \sim N(0, P)$ and $Q = \emptyset$. Theorem 2 (provided below) states that the corner point of this region (e.g., corner point 610 in FIG. 6A) is not achievable using any (s, t, $d_1$, $d_2$, F) rate-splitting scheme.

Theorem 2:

For the symmetric Gaussian interference channel with $S<I<S(S+1)$, $$R_1^*(s, t, d_1, d_2) < C\left(\frac{I}{1+S}\right)$$

for any finite s, t and decoding orders $d_1$, $d_2$.

The idea of the standard rate-splitting scheme for the multiple access channel is to represent each message by multiple parts and encode them into superimposed layers. Combined with successive cancellation decoding, this superposition coding scheme transforms the multiple access channel into a sequence of point-to-point channels. For the interference channel, which consists of two underlying multiple access channels $p(y_i|x_1,x_2)$, i=1, 2, however, this idea no longer works. Here rate-splitting induces two sequences of point-to-point channels that have different qualities in general. To ensure reliable communication, the messages have to be loaded at the rate of the worse channel on each layer, which in general incurs a total rate loss. Theorem 2 essentially states that there is no split of the messages that "equalizes" the qualities of the two point-to-point channels on each layer, even when the decoding orders of the layers are optimized Rate-Splitting is alternatively viewed as mapping a boundary point of one multiple access rate region to a corner point of another multiple access rate region in a higher dimensional space. Theorem 2 shows that there is no such mapping in general under which the corresponding corner points for the two multiple access channels coincide.

Proof of Theorem 2

For the simplicity of notation, the claim for $Q = \emptyset$ is proven. The case for general Q follows the same logic. The following three lemmas are needed.

Lemma 1:

For any (s, t, $d_1$, $d_2$, F) rate-splitting scheme that achieves $R_1^*(s, t, d_1, d_2, F)$ it is assumed without loss of generality that s=t and the decoding orders are $$d_1^*: U_1 \to V_1 \to U_2 \to V_2 \to \ldots \to U_{s-1} \to V_{s-1} \to U_s,$$

$$d_2^*: U_1 \to U_2 \to \ldots \to U_s \to V_1 \to V_2 \to \ldots \to V_s.$$

Lemma 2:

A necessary condition for (2,2, $d_1$, $d_2$, F) rate-splitting scheme to attain the corner point is that the distribution F is such that $X_1$, $X_2 \sim N(0, P)$.

Lemma 3:

Let F(u,x) be any distribution such that $X \sim N(0,P)$ and $I(U;Y)=0$, where $Y=X+Z$ with $Z \sim N(0,1)$ independent of X. Then, $I(U;X)=0$. Now the insufficiency is established. It is straightforward to check for the case s=1. For s=2, is proven by contradiction. $(U,X_1)=(U_1,U_2)$ and $(V,X_2)=(V_1,V_2)$ is written. The achievable rate region of the $(2,2d_1^*, d_2^*, F)$ rate-splitting scheme is the set of rate pairs $(R_1, R_2)$ such that $$R_1 < \min\{I(U;Y_1), I(U;Y_2)\} + \min\{I(X_1;Y_1|U,V), I(X_2;Y_2|U)\} := I_1,$$

$$R_2 < \min\{I(V;Y_1|U), I(V;Y_2|X_1)\} + I(X_2;Y_2|X_1,V) := I_2,$$

Assume that the corner point of the capacity region is achieved by the (2,2, $d_1^*$, $d_2^*$, F) rate-splitting scheme, that is, $$I_1 = C(I/(1+S)), \tag{13}$$

$$I_2 = C(S). \tag{14}$$

Then, by Lemma 2, $X_1 \sim N(0,P)$ and $X_2 \sim N(0,P)$ is required. Consider $$I_1 = \min\{I(U; Y_1), I(U; Y_2)\} + \min\{I(X_1; Y_1 \mid U, V), I(X_1; Y_2 \mid U)\} \leq \tag{15}$$
$$I(U; Y_1) + I(X_1; Y_2 \mid U)$$

$$= h(Y_1) - h(Y_1 \mid U) + h(Y_2' \mid U) - h(Y_2' \mid X_1), \tag{16}$$

where $Y_2' = Y_2/g = X_1 + (X_2 + Z_2)/g$. Since $\frac{1}{2} \log(2\pi e(S+1)/g^2) = h(Y_2' \mid X_1) \leq h(Y_2' \mid U) \leq h(Y_2') = \frac{1}{2} \log(2\pi e(I+S+1)/g^2)$, there exists an $\alpha \in [0,1]$ such that $h(Y_2' \mid U) = (\frac{1}{2}) \log(2\pi e(\alpha I + S + 1)/g^2)$. Moreover, since $X_2 \sim N(0,P)$ and $I < S(1+S)$, the channel $X_1 \to Y_1$ is a degraded version of the channel $X_1 \to Y_2'$ i.e., $Y_1 = Y_2' + Z'$, where $Z' \sim N(0, I+1-(S+1)/g^2)$ is independent of $X_1$ and $X_2$. By the entropy power inequality, $2^{2h(Y_1 \mid U)} \geq 2^{2h(Y_2' \mid U)} + 2^{2h(Z' \mid U)} = 2\pi e(\alpha S + I + 1)$. Therefore, it follows from (16) that $$I_1 \leq h(Y_1) - h(Y_1 \mid U) + h(Y_2' \mid U) - h(Y_2' \mid X_1) \leq$$
$$\frac{1}{2} \log\left(\frac{(I+S+1)(\alpha I + S + 1)}{(\alpha S + I + 1)(1+S)}\right) \stackrel{(aaa)}{\leq} C(I/(1+S)), \tag{30}$$

where (aaa) follows since $S < I$. To match the standing assumption in (13), equality in (aaa) is needed, which forces $\alpha = 1$ and $h(Y_2' \mid U) = (\frac{1}{2}) \log(2\pi e(I+S+1)/g^2) = h(Y_2')$, i.e., $I(U; Y_2') = 0$. It is noted that $X_1, X_2 \sim N(0,P)$ and the channel from $X_1$ to $Y_2'$ is a Gaussian channel. Applying Lemma 3 yields $$I(U; X_1) = 0. \tag{17}$$

Now, $I_2$ can be simplified to $$I_2 = \min\{I(V; Y_1 \mid U), I(V; Y_2 \mid X_1)\} + I(X_2; Y_1 \mid X_1, V) \stackrel{(bbb)}{=} \tag{18}$$
$$\min\{I(V; Y_1), I(V; Y_2 \mid X_1)\} + I(X_2; Y_1 \mid X_1, Y)$$

$$\leq I(V; Y_1) + I(X_2; Y_2 \mid X_1, V) = \tag{19}$$
$$h(\tilde{Y}_1) - h(\tilde{Y}_1 \mid V) + h(\tilde{Y}_2 \mid V) - h(\tilde{Y}_2 \mid X_1, X_2),$$

where (bbb) follows since $I(U; Y_1 \mid V) \leq I(U; Y_1 \mid X_2) = I(U; X_1 + Z_1) \leq I(U; X_1) = 0$, which implies $I(V; Y_1 \mid U) = I(V; Y_1)$. In (19), $\tilde{Y}_1 = Y_1/g = X_2 + (X_1 + Z_1)/g$ and $\tilde{Y}_2 = X_2 + Z_2$. Since $\frac{1}{2} \log(2\pi e) = h(\tilde{Y}_2 \mid X_2) \leq h(\tilde{Y}_2 \mid V) \leq h(\tilde{Y}_2) = \frac{1}{2} \log(2\pi e(1+S))$, there exists a $\beta \in [0,1]$ such that $h(\tilde{Y}_2 \mid V) = (\frac{1}{2}) \log(2\pi e(1+\beta S))$. Moreover, since $X_1 \sim N(0,P)$ and $1 < S(1+S)$, $Y_1$ is a degraded version of $\tilde{Y}_2$, i.e., $\tilde{Y}_1 = \tilde{Y}_2 + \tilde{Z}$, where $\tilde{Z} \sim N(0, (1+S)/g^2 - 1)$ is independent of $X_1$ and $X_2$. Applying the entropy power inequality, is $2^{2h(\tilde{Y}_1 \mid V)} \geq 2^{2h(\tilde{Y}_2 \mid V)} + 2^{2h(\tilde{Z} \mid V)} = 2\pi e(\beta S + (1+S)/g^2)$. Therefore, it follows from (19) that $$I_2 \leq h(\tilde{Y}_1) - h(\tilde{Y}_1 \mid V) + h(\tilde{Y}_2 \mid V) - h(\tilde{Y}_2 \mid X_1, X_2) \leq$$
$$\frac{1}{2} \log\left(\frac{(I+S+1)(1+\beta S)}{g^2(\beta S + (1+S)/g^2)}\right) \stackrel{(ccc)}{\leq} C(S),$$

where (ccc) follows from the channel condition $I < (1+S)S$.

To match the standing assumption in (14), equality in (ccc) is needed, which forces $\beta = 1$ and $h(\tilde{Y}_2 \mid V) = (\frac{1}{2}) \log(2\pi e(1+s)) = h(\tilde{Y}_2)$, i.e., $I(V; \tilde{Y}_2) = 0$. It is noted that $X_2 \sim N(0,P)$ and the channel from $X_2$ to $\tilde{Y}_2$ is a Gaussian channel. Applying Lemma 3 yields $$I(V; X_2) = 0. \tag{20}$$

However, conditions (17) and (20) imply $$I(X_1; Y_1 \mid U, V) = I(U, V, X_1; Y_1) - I(U, V; Y_1) =$$
$$I(X_1; Y_1) + I(V; Y_1 \mid X_1) - I(U; Y_1) - I(V; Y_1 \mid U) \stackrel{(ddd)}{=} I(X_1; Y_1),$$

where (ddd) follows since $I(U; Y_1) \leq I(U; X_1) = 0$ and $I(V; Y_1 \mid U) \leq I(V; Y_1 \mid X_1) \leq I(V; X_2) = 0$. Therefore, $$I_1 = I(X_1; Y_1) = C(S/(1+I)) < C(I/(1+S)),$$

which contradicts (13) and completes the proof for s=2.

Finally, the case when s>2 is considered. Switching the order of the minimum and the sum, is bound $$R_1 < \min\{I(U_1; Y_1), I(U_1; Y_2)\} + \tag{21}$$
$$\sum_{j=2}^{s} \min\{I(U_j; Y_1 \mid U^{j-1}, V^{j-1}), I(U_j; Y_2 \mid U^{j-1})\} \leq$$
$$I(U_1; Y_1) + I(X_1; Y_2 \mid U_1)$$

$$R_2 < \sum_{j=1}^{s-1} \min\{I(V_{2j}, Y_1 \mid V_1^{j-1}, V_2^{j-1}), I(V_{2j}; Y_2 \mid X_1, V_2^{j-1})\} + \tag{22}$$
$$I(V_{2s}; Y_2 \mid X_1, V_2^{s-1}) \leq$$
$$\min\{I(V_1, Y_1 \mid U_1), I(V_1; Y_2 \mid X_1)\} + I(X_2; Y_2 \mid X_1 V_1)$$

It is noted that (21) and (22) are of the same form as (15) and (18), respectively. Therefore, the suboptimality follows from the same arguments as when s=2. It is shown that any single-block rate-splitting scheme is strictly suboptimal for the two-user-pair symmetric Gaussian interference channels. However, by sending the messages over multiple blocks and using sliding-window decoding, the simultaneous decoding inner bound is achievable. Compared to implementing simultaneous decoding that requires multiuser sequence detection, the disclosed sliding-window superposition coding scheme has a simpler implementation, since messages can be decoded one at a time without any need for multiuser sequence detection.

For the general K-sender L-receiver interference networks, where each sender transmits an independent message and each receiver recovers a subset of the K messages, one can similarly send the messages over more than two blocks. By carefully scheduling the decoding orders for each receiver, the sliding-window superposition coding scheme can be shown to achieve the simultaneous decoding inner bound for the interference networks, which includes the Han-Kobayashi inner bound for two-user-pair interference channels as a special case.

Although heterogeneous (UX) superposition coding was discussed exemplarily herein, a similar conclusion holds for homogeneous (UV) superposition. For the Gaussian interference channels, one can split $X_1$ into independent U and V, and take the function $X_1 = U + V$.

Exemplary Embodiments of the SWSC Scheme

Symbol-by-Symbol Mapping

There can be many ways how U and V are mapped into the channel input signal $X_1$. In some embodiments, the choice of the signals or layers U and V can be based on past data collected from network operation. For example, U and V can be chosen from a modulation scheme (such as BPSK, QPSK, QAM, etc.) according to a probability distribution such as Gaussian distribution or a uniform distribution. For example, if QPSK constellation scheme is chosen, signals U and V can be chosen from one of four possible constellation points, based on a probability distribution function. Thus, the mapping of signals U and V to input signal $X_1$ can be an implementer's choice.

For example, if $X_1$ is Gaussian with power P, then signals U and V can be chosen to be Gaussian with power $\alpha P$ and $(1-\alpha)P$ respectively, where P is a normalized measure of power, and let $X_1=U+V$. That is, some embodiments of the disclosed system provide the option of choosing how much power can be allocated to each of the layers. For a 2-layer system, this is designated by the parameter $\alpha$. Thus, in embodiments corresponding to a N-layer superposition scheme, the chosen power allocation parameters for N layers can be represented by N parameters $\alpha_1, \alpha_2, \alpha_3, \ldots \alpha_N$. In some embodiments, the power allocation parameters can be determined, e.g., by a transmitter, dynamically based on the channel quality between the transmitter and a receiver. Thus, for example, at a first time instance, if the channel quality between a transmitter-receiver pair is poor, the parameters would be different than a second time instance when the channel quality between the same transmitter improves. Furthermore, in embodiments of the disclosed system, the parameters chosen by one transmitter for transmission to a given receiver, or under certain given power condition, may be different than the parameters chosen by another transmitter to the same receiver and similar power conditions.

As another example, U and V can be chosen to be BPSK signals and distributed according to the random distribution Unif $\{-1, +1\}$. Then, in some embodiments, $X_1$ can be expressed as $X_1=\sqrt{P}\sqrt{\alpha}U+\sqrt{P}\sqrt{1-\alpha}V$ to form a 4-PAM signal. For example, choosing $\alpha=0.8$ makes $X_1$ a uniformly-spaced 4-PAM signal $$X_1 \in \{-3\sqrt{P}/\sqrt{5}, -\sqrt{P}/\sqrt{5}, +\sqrt{P}/\sqrt{5}, +\sqrt{P}/\sqrt{5}\}.$$

As a third example, in some embodiments, U and V can be BPSK signals and distributed according to Unif $\{-1, +1\}$. By choosing $X_1=U \cdot V$, in such embodiments, another BPSK signal that is a non-liner combination of the signals U and V can be used as the channel input.

In some embodiments, the layers U and V can be chosen optimally by solving at least equations (3) and (4) provided above, for a given type of channel and a desired transmission rate of the channel. For example, a channel type can be a Rayleigh fading channel (such as a slow or a fast fading channel), or a Doppler channel, or an additive white Gaussian noise (AWGN) channel, or any other channel type between a transmitter-receiver pair. In some embodiments, the receiver can provide feedback to a transmitter on the quality of the channel dynamically, for example, in the form of control information fed back to the transmitter. A receiver can determine (based on a received signal strength indicator or pilot signals) the quality of a channel type. Such information can be utilized by the transmitter in choosing the layers U and V. For example, the modulation scheme, the probability distribution, the power allocated between the layers, etc. can be determined by the transmitter based on the control information from the receiver. In some embodiments, both the transmitter and the receiver can jointly determine (e.g., either based on a predetermined rule or based on a dynamically performed negotiation on-the-fly) the modulation scheme, the probability distribution, the power allocated between the layers, etc. In some embodiments, the combination of the layers U and V can be arbitrarily chosen by a transmitter. For example, the mathematical function governing how U and V can be combined, can also be determined by a transmitter. In the examples discussed above, the signals U and V are shown to be combined linearly (i.e., U+V) or they can be combined non-linearly (i.e., U. V). Thus, embodiments of the disclosed system facilitate the combination of various layers according to any suitable mathematical function. The choice of such a mathematical function can be determined arbitrarily or can be based on solving the rate equations disclosed herein.

Decoding Orders

In some embodiments, a receiver can receive transmissions from multiple senders. In such scenarios, a receiver has to determine a decoding order for decoding the signals from the different senders. That is, a receiver has to determine not only a decoding order for the transmission of the senders, but additionally, for a given sender, a decoding order for the different layers of a sender's transmissions.

For example, based on the exemplary encoding order of FIG. 6B, receiver i=1, 2 can either treat interference as noise or pick from one of the following decoding orders. The example in FIG. 6B assumes that the received signal $Y_1$ is received at receiver 1, and signal $Y_2$ is received at receiver 2. These signals are received versions of the signals U and $X_2$ respectively from sender 1 and sender 2, after passing through the channel. It is also assumed that signal $X_1$ is known at both receiver 1 and receiver 2. Further, FIG. 6B shows as an example that receiver 2 decodes the received signal $Y_2$ with a delay of one (1) block compared to the decoding of signal $Y_1$ at receiver 1.

For a decoding order:

$$d_{i1}: \hat{m}_{21} \to \hat{m}_{11} \to \hat{m}_{22} \to \hat{m}_{12} \to \ldots \to \hat{m}_{2,b-1} \to \hat{m}_{1,b-1} \to \hat{m}_{2,b},$$

the corresponding rate region $\mathcal{R}_{i1}$ at receiver i is the set of rate pairs $(R_1, R_2)$ such that $$R_1 < I(U;Y_i) + I(V;Y_1|_2),$$

$$R_2 < I(X_2;Y_i|U).$$

For a decoding order:

$$d_{i2}: \hat{m}_{11} \to \hat{m}_{22} \to \hat{m}_{12} \to \hat{m}_{22} \to \ldots \to \hat{m}_{1,b-1} \to \hat{m}_{2,b-1} \to \hat{m}_{2,b},$$

the corresponding rate region $\mathcal{R}_{i2}$ at receiver i is the set of rate pairs $(R_1, R_2)$ such that $$R_1 < I(X_1;Y_i),$$

$$R_2 < I(X_2;Y_i|X_1).$$

For a decoding order:

$$d_{i3}: \hat{m}_{21} \to \hat{m}_{22} \to \hat{m}_{11} \to \hat{m}_{23} \to \hat{m}_{12} \to \ldots \to \hat{m}_{2,b} \to \hat{m}_{1,b-1},$$

The corresponding rate region $\mathcal{R}_{i3}$ at receiver i is the set of rate pairs $(R_1, R_2)$ such that $$R_1 < I(X_1;Y_i|X_2),$$

$$R_2 < I(X_2;Y_i).$$

The achievable rate region for treating interference as noise at receiver i is denoted as $\mathcal{R}_{i0}$, which is the set of rate pairs $(R_1, R_2)$ such that $$R_1 < I(X_i; Y_i).$$

Therefore, the combined achievable rate region for sliding-window superposition coding is $$\bigcup_{k=0}^{3}\bigcup_{l=0}^{3}(\mathcal{R}_{1k} \cap \mathcal{R}_{2l}),$$

for some pmf $p(u)p(v)p(x_2)$ and function $x_i(u, v)$.

Superposition Layers

In some embodiments, the number of superposition layers at each sender can be varied. For example, if $X_1$ is split into three layers $(U_1, U_2, U_3)$ and $X_2$ is left unsplit, there can be more flexibilities in choosing the decoding order at each receiver, than when $X_1$ is split into two layers. Thus, embodiments of the disclosed system facilitate choosing more possibilities of decoding orders, if the number of layers at the sender is increased. Receiver i=1, 2, can either choose from one of the decoding orders $\{d_{ik}: k \in [1:4]\}$, or treat interference as noise.

For decoding order $d_{i1}$: $\hat{m}_{11} \to \hat{m}_{22} \to \hat{m}_{12} \to \ldots \to \hat{m}_{1,b-1} \to \hat{m}_{2,b-1} \to \hat{m}_{2,b-1} \to \hat{m}_{2,b}$, the achievable rate region $\mathcal{R}_{i1}(\rho)$ is the set of rate pairs $(R_1, R_2)$ such that $$R_1 < I(X_1; Y_i),$$

$$R_2 < I(X_2; Y_i | X_1).$$

For decoding order $d_{i2}$: $\hat{m}_{21} \to \hat{m}_{11} \to \hat{m}_{22} \to \hat{m}_{12} \to \ldots \to \hat{m}_{2,b-1} \to \hat{m}_{1,b-1} \to \hat{m}_{2,b-1} \to \hat{m}_{2,b}$, the achievable rate region $\mathcal{R}_{i2}(\rho)$ is the set of rate pairs $(R_1, R_2)$ such that $$R_1 < I(U_1, U_2; Y_i) + I(U_3; Y_i | U_1, U_2, X_2),$$

$$R_2 < I(X_2; Y_i | U_1, U_2).$$

For decoding order $d_{i3}$: $\hat{m}_{21} \to \hat{m}_{22} \to \hat{m}_{11} \to \hat{m}_{23} \to \hat{m}_{12} \to \hat{m}_{24} \to \ldots \to \hat{m}_{1,b-2} \to \hat{m}_{2,b}$, the achievable rate region $\mathcal{R}_{i3}(\rho)$ is the set of rate pairs $(R_1, R_2)$ such that $$R_1 < I(U_1; Y_i) + I(U_2, U_3; Y_i | U_1, X_2),$$

$$R_2 < I(X_2; Y_i | U_1).$$

For decoding order $d_{i4}$: $\hat{m}_{21} \to \hat{m}_{22} \to \hat{m}_{23} \to \hat{m}_{11} \to \hat{m}_{24} \to \hat{m}_{12} \to \ldots \to \hat{m}_{2,b} \to \hat{m}_{1,b-2}$, the achievable rate region $\mathcal{R}_{i4}(\rho)$ is the set of rate pairs $(R_1, R_2)$ such that $$R_1 < I(X_1; Y_i | X_2),$$

$$R_2 < I(X_2; Y_i).$$

We denote the achievable rate region for treating interference as noise at receiver I as $\mathcal{R}_{i0}(\rho)$, which is the set of rate pairs $(R_1, R_2)$ such that $$R_i < I(X_i; Y_i).$$

The combined achievable rate region given current encoding is $$\bigcup_{k=0}^{4}\bigcup_{l=0}^{4}(\mathcal{R}_{1k}(\rho) \cap \mathcal{R}_{2l}(\rho))$$

for some pmf $\rho(u_1)\rho(u_2)\rho(u_3)\rho(x_2)$ and function $x_1(u_1, u_2, u_3)$.

In some embodiments, choosing an optimal decoding order can include solving the rate equations disclosed above, or a given type of channel and a desired transmission rate of the channel. For example, such considerations can be similar to the considerations undertaken by a transmitter in choosing the layers, or transmission parameters in connection with choosing the layers as discussed above.

Figure 7:
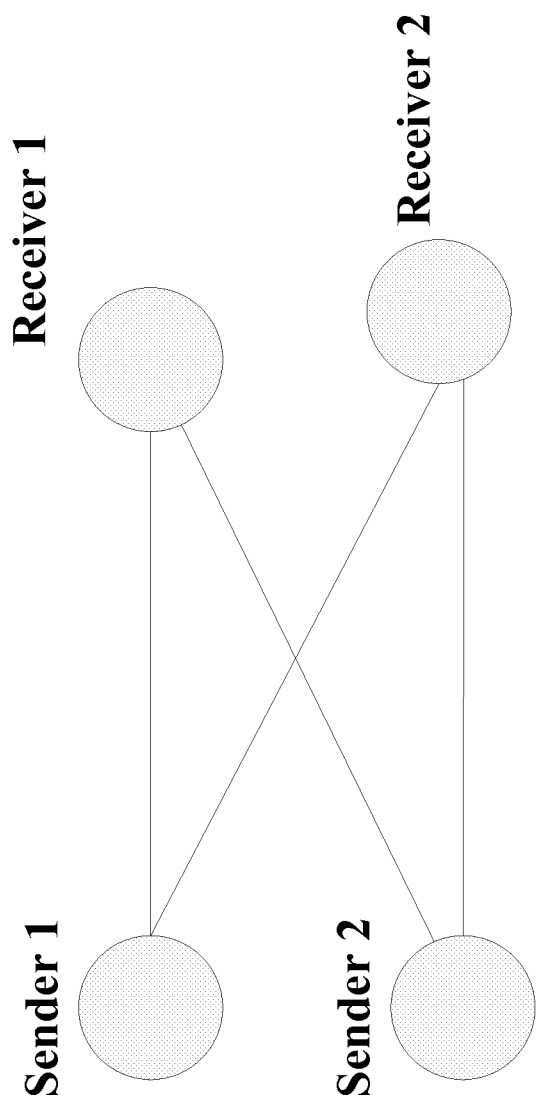
FIG. 7 shows an illustrate diagram of a wireless communication system.

FIG. 7 shows an illustrate diagram of a wireless communication system, with two pairs of senders and receivers. Receiver 1 receives a signal from sender 1 and sender 2. Similarly, receiver 2 receives a signal from sender 1 and sender 2. Embodiments disclosed herein can be used as a system-wide method for mitigating the adverse effect of interference caused by other communicating parties, e.g., in connection with 5G cellular systems and wi-fi systems.

Figure 8:
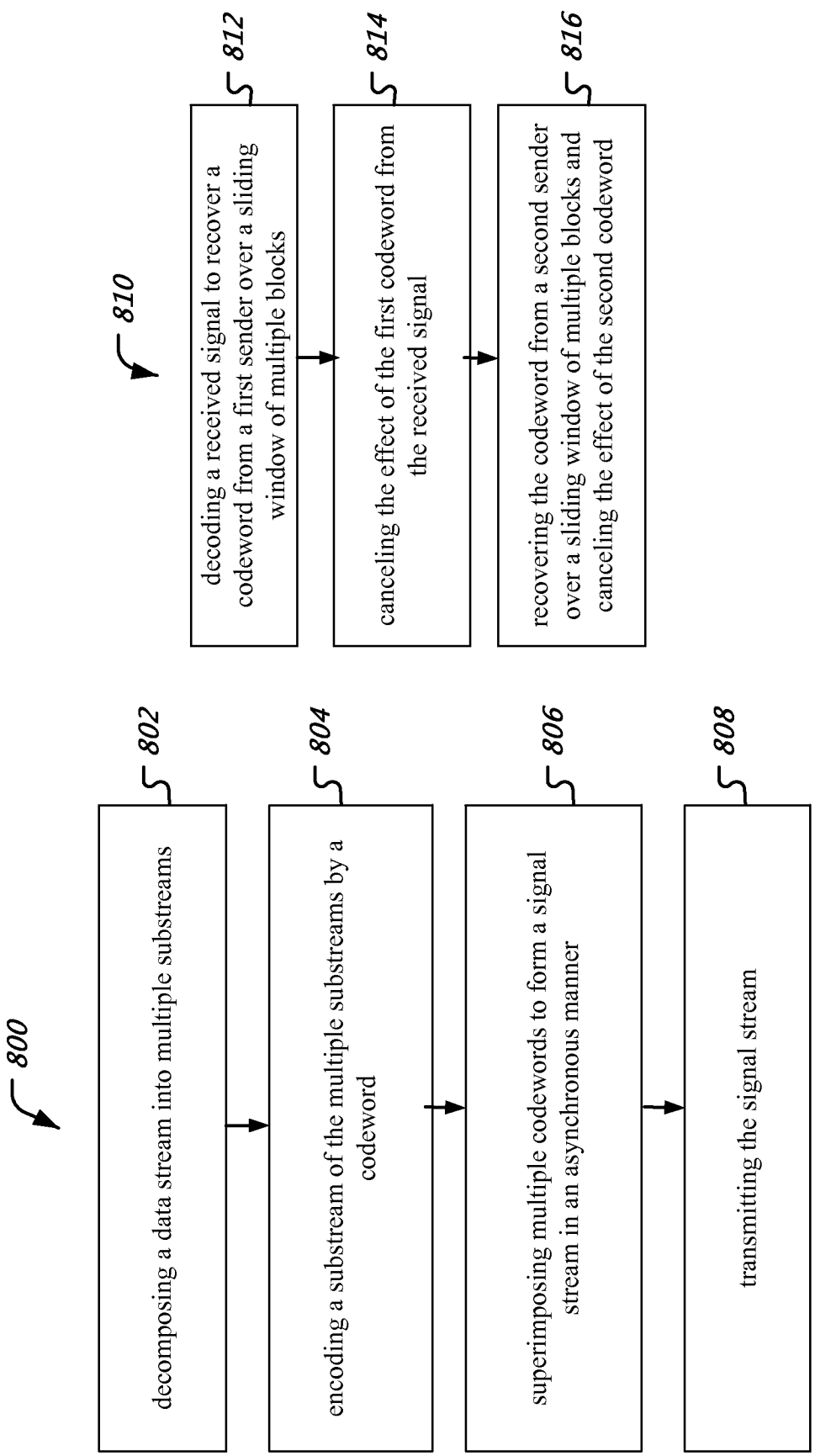
FIG. 8 illustrates an exemplary method for transmitting a signal stream and receiving a signal stream.

FIG. 8 illustrates an exemplary method 800 for transmitting a data stream from a sender. At 802, the method 800 decomposes a data stream into multiple substreams. At 804, the method 800 encodes a substream of the multiple substreams by a codeword over multiple blocks. At 806, the method 800 superimposes multiple codewords to form a signal stream in an asynchronous manner. At 808, the method 800 transmits the signal stream.

FIG. 8 illustrates an exemplary method 810 for receiving a signal stream by a receiver. At 812, the method 800 decodes the received signal to recover a codeword from a first sender over a sliding window of multiple blocks, wherein a codeword is an encoding of a substream of a data stream from a sender. At 814, the method 800 cancels the effect of the first codeword from the received signal. At 816, the method 800 recovers the codeword from a second sender over a sliding window of multiple blocks and cancels the effect of the second codeword. The two codeword streams may be received at the same time as one signal. In some embodiments, the method 810 may include, among other features, determining and applying a decoding order to recover the codewords from the senders. Examples of some embodiments and associated considerations are provided in paras [0093]-[00114].

Figure 9:
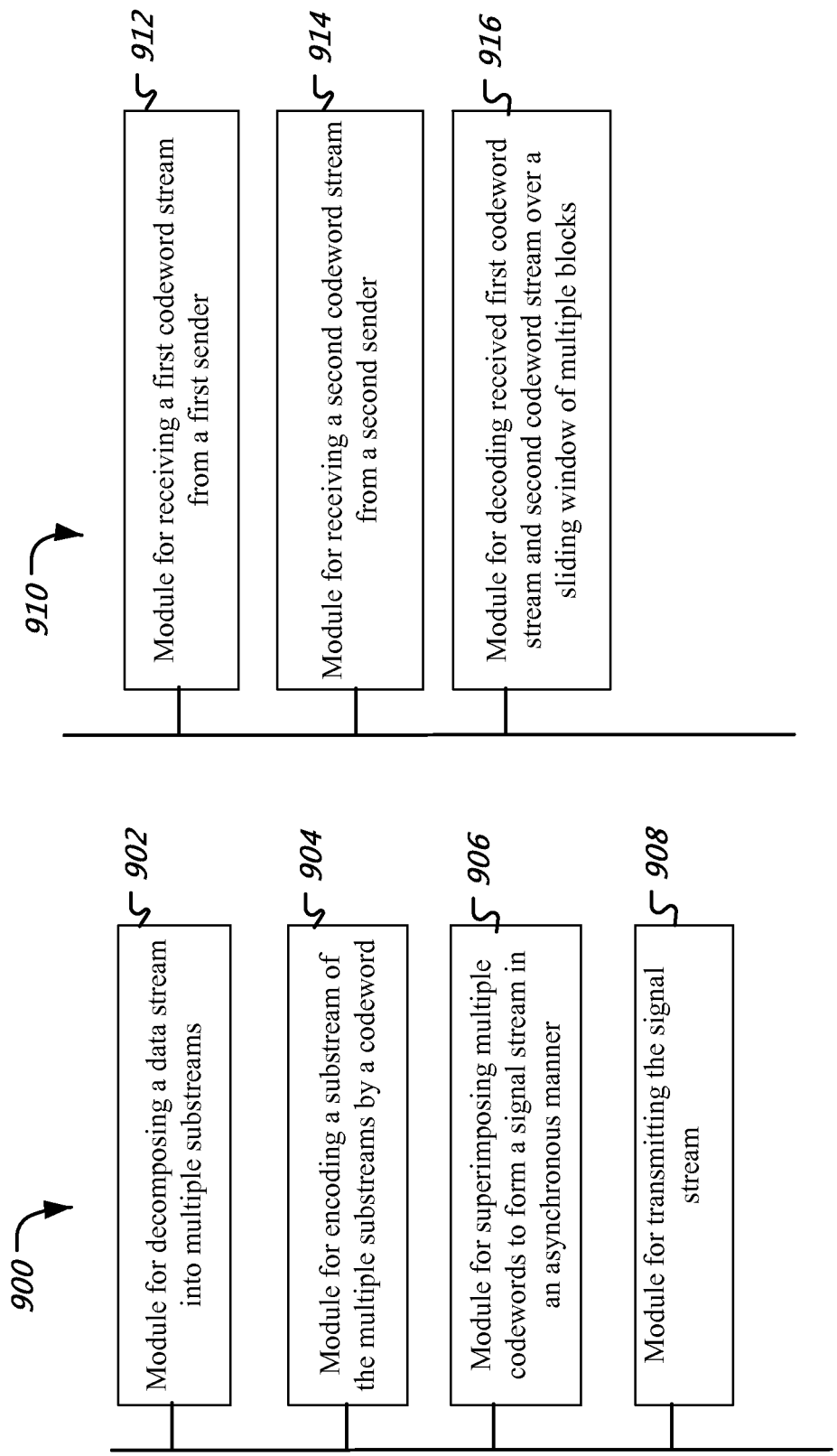
FIG. 9 illustrates an exemplary apparatus for transmitting a signal stream and receiving a signal stream.

FIG. 9 illustrates an exemplary apparatus 900 for transmitting a signal stream from a sender. The apparatus comprises a module 902 for decomposing a data stream into multiple substreams; a module 904 for encoding a substream of the multiple substreams by a codeword; a module 906 for superimposing multiple codewords to form a codword stream; and a module 908 for transmitting the codword stream in an asynchronous manner.

FIG. 9 illustrates an exemplary module 910 for receiving a signal stream by a receiver. The method comprises a module 912 for receiving a first codeword stream from a first sender; a module 914 for receiving a second codeword stream from a second sender; and a module 916 for decoding received first codeword stream and second codeword stream over a sliding window of multiple blocks, wherein a codeword stream is generated by superimposing multiple codewords, and each codeword is an encoding of a substream of a signal stream from a sender. In some embodiments, the method 900 may include, among other features, generating the codeword stream by using a nonlinear mathematical function to combine the respective substreams or codewords. Examples of some embodiments and associated considerations are provided in paras [0093]-[00114].

Implementations of the subject matter, modules, and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contain many specifics, these should not be construed as limitations on the scope of any disclosed methods or of what may be claimed, but rather as descriptions of features that may be specific to particular embodiments of particular disclosed methods. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a subcombination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed are techniques and structures as described and shown, including:

1. A method for transmitting a first data stream and a second data stream from a first sender and a second sender, respectively, comprising:
    decomposing the first data stream into multiple first substreams and the second data stream into multiple second substreams;
    encoding each substream of the multiple first and second substreams into a corresponding codeword;
    generating a first signal stream including multiple signal layers each carrying codewords encoded from the multiple first substreams and codewords encoded from the multiple second substreams such that the codewords encoded from the multiple first substreams and the codewords encoded from the multiple second substreams are carried through the multiple signal layers by superimposing the codewords in a staggering manner over the multiple signal layers;
    generating a second signal stream including at least one signal layer carrying codewords encoded from the multiple second substreams and codewords encoded from the multiple first substream; and
    transmitting the first signal stream and the second signal stream.

2. The method of claim 1, wherein each of the multiple signal layers includes multiple blocks, and the certain codeword spans over the multiple blocks.

3. The method of claim 2, wherein a position of each block included in the multiple blocks is arranged to achieve optimum performance.

4. The method of claim 1, wherein the encoding each substream is based on block Markov coding.

5. A method for receiving a data stream by a receiver, comprising:

receiving a first codeword stream from a first sender, wherein the first codeword stream is based on a reception of a codeword stream through a first transmission channel between the first sender and the receiver, and wherein the first transmission channel includes multiple superposition signal layers;

receiving a second codeword stream from a second sender, wherein the second codeword stream is based on a reception of a codeword stream through a second transmission channel between the second sender and the receiver, wherein the second transmission channel includes a single signal layer, and wherein the second sender is different from the first sender;

decoding the received first codeword stream and the second codeword stream over a sliding window of multiple blocks, wherein the codeword stream is generated by superimposing multiple codewords, wherein each codeword is an encoding of a substream of a data stream from a sender, wherein the single signal layer carries each codeword in a single block, wherein the multiple superposition signal layers carry codewords such that a certain codeword is carried through the multiple superposition signal layers in different windows of the multiple blocks, and, at each window of the multiple blocks, the certain codeword is decoded after canceling codewords known from decoding at previous windows of the multiple blocks.

6. The method of claim 5, wherein multiple codewords from the first sender and from the second sender are recovered one by one.

7. The method of claim 5, wherein the decoding involves a decoding order of each codeword included in the first codeword stream and the second codeword stream, and wherein the decoding order is configurable.

8. The method of claim 5, wherein the decoding involves a decoding order of each codeword included in the first codeword stream and the second codeword stream, and wherein the decoding order is configurable, based, at least in part, on (i) a quality of the first transmission channel, and (ii) a quality of the second transmission channel.

9. The method of claim 5, wherein the substream is generated using block Markov coding.

10. An apparatus at a sender comprising:

a memory that stores instructions;

a processor that reads the instructions from the memory and implements a method comprising:

decomposing a first data stream into multiple first substreams and a second data stream into multiple second substreams;

encoding each substream of the multiple first and second substreams into a corresponding codeword;

generating a first signal stream including multiple signal layers each carrying codewords encoded from the multiple first substreams and codewords encoded from the multiple second substreams such that the codewords encoded from the multiple first substreams and the codewords encoded from the multiple second substreams are carried through the multiple signal layers by superimposing the codewords in a staggering manner over the multiple signal layers;

generating a second signal stream including at least one signal layer carrying codewords encoded from the multiple second substreams and codewords encoded from the multiple first substream; and transmitting the first signal stream and the second signal stream.

11. The apparatus of claim 10, wherein each of the multiple signal layers includes multiple blocks, and the certain codeword spans over the multiple blocks.

12. The apparatus of claim 11, wherein a position of each block included in the multiple blocks is arranged to achieve optimum performance.

13. The apparatus of claim 10, wherein the encoding each substream is based on block Markov coding.

14. An apparatus at a receiver comprising:

a memory that stores instructions;

a processor that reads the instructions from the memory and implements a method comprising:

receiving a first codeword stream from a first sender, wherein the first codeword stream is based on a reception of a codeword stream through a first transmission channel between the first sender and the receiver, and wherein the first codeword stream includes multiple superposition signal layers;

receiving a second codeword stream from a second sender, wherein the second codeword stream is based on a reception of a codeword stream through a second transmission channel between the second sender and the receiver, and wherein the second sender is different from the first sender;

decoding the received first codeword stream and the second codeword stream over a sliding window of multiple blocks, wherein the first codeword stream is generated by superimposing multiple codewords, wherein the multiple codewords include codewords encoded from multiple first substreams of a data stream from the first sender and codewords encoded from multiple second substreams of a data stream from the second sender, wherein the multiple codewords are superimposed such that the codewords encoded from the multiple first substreams and the codewords encoded from the multiple second substreams are carried through multiple superposition signal layers in different windows of the multiple blocks, and, at each window of the multiple blocks, the certain codeword is decoded after canceling codewords known from decoding at previous windows of the multiple blocks.

15. The apparatus of claim 14, wherein multiple codewords from the first sender and from the second sender are recovered one by one.

16. The apparatus of claim 14, wherein the decoding involves a decoding order of each codeword included in the first codeword stream and the second codeword stream, and wherein the decoding order is configurable.

17. The apparatus of claim 14, wherein the decoding involves a decoding order of each codeword included in the first codeword stream and the second codeword stream, and wherein the decoding order is configurable, based, at least in part, on (i) a quality of the first transmission channel, and (ii) a quality of the second transmission channel.

18. The apparatus of claim 14, wherein the substream is generated using block Markov coding.

19. A system for communication comprising at least two senders and a receiver, the receiver and each of the at least two senders comprising a processor, the at least two senders being different,
- (i) each sender in the at least two senders is configured to implement a first method comprising:
  - decomposing a first data stream into multiple first substreams and a second data stream into multiple second substreams;
  - encoding each substream of the multiple first and second substreams into a corresponding codeword;
  - generating a first signal stream including multiple signal layers each carrying codewords encoded from the multiple first substreams and codewords encoded from the multiple second substreams such that the codewords encoded from the multiple first substreams and the codewords encoded from the multiple second substreams are carried through the multiple signal layers by superimposing the codewords in a staggering manner over the multiple signal layers;
  - generating a second signal stream including at least one signal layer carrying codewords encoded from the multiple second substreams and codewords encoded from the multiple first substream; and
  - transmitting the first signal stream and the second signal stream, and
- (ii) the receiver configured to implement a second method comprising:
  - receiving a first codeword stream from a first sender in the at least two senders, wherein the first codeword stream is based on a reception of a codeword stream through a first transmission channel between the first sender and the receiver, and wherein the first codeword stream includes multiple superposition signal layers;
  - receiving a second codeword stream from a second sender in the at least two senders, wherein the second codeword stream is based on a reception of the codeword stream through a second transmission channel between the second sender and the receiver;
  - decoding the received first codeword stream and the second codeword stream over a sliding window of multiple blocks, wherein the first codeword stream is generated by superimposing multiple codewords, wherein the multiple codewords include codewords encoded from multiple first substreams of the data stream from the first sender and codewords encoded from multiple second substreams of a data stream from the second sender, wherein, at each window of the multiple blocks, the certain codeword is decoded after canceling codewords known from decoding at previous windows of the multiple blocks.

20. The system of claim 19, wherein the substream is based on block Markov coding.

* * * * *